(12) United States Patent
Kundu et al.

(10) Patent No.: US 12,184,751 B2
(45) Date of Patent: Dec. 31, 2024

(54) WIDE-RANGE INDUCTOR-BASED DELAY-CELL AND AREA EFFICIENT TERMINATION SWITCH CONTROL

(71) Applicant: Intel Corporation, Santa Clara, CA (US)

(72) Inventors: Sandipan Kundu, Hillsboro, OR (US);
Ajay Balankutty, Hillsboro, OR (US);
Bong Chan Kim, Hillsboro, OR (US);
Yutao Liu, Hillsboro, OR (US);
Jihwan Kim, Portland, OR (US); Kai Yu, Portland, OR (US); Gurmukh Singh, Gilbert, AZ (US); Stephen Kim, Beaverton, OR (US); Richard Packard, Livermore, CO (US); Frank O'Mahony, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 573 days.

(21) Appl. No.: 17/341,150

(22) Filed: Jun. 7, 2021

(65) Prior Publication Data
US 2022/0200781 A1    Jun. 23, 2022

Related U.S. Application Data

(60) Provisional application No. 63/127,956, filed on Dec. 18, 2020.

(51) Int. Cl.
*H04L 7/033* (2006.01)
*H03K 5/135* (2006.01)
(Continued)

(52) U.S. Cl.
CPC ........... *H04L 7/0331* (2013.01); *H03K 5/135* (2013.01); *H03L 7/087* (2013.01); *H04L 7/0025* (2013.01)

(58) Field of Classification Search
CPC ..... H04L 7/0331; H04L 7/0025; H03K 5/135; H03K 2005/00032; H03K 5/15006; H03L 7/087; H03L 7/22
See application file for complete search history.

(56) References Cited

U.S. PATENT DOCUMENTS 4,994,695 A * 2/1991 Bazes ............... H03K 5/15066
                                                    327/295
5,526,380 A * 6/1996 Izzard ..................... H04L 7/033
                                                    375/376
(Continued)

FOREIGN PATENT DOCUMENTS

CN         1483268 A  *  3/2004  ............. H03B 27/00
CN       101931398 A  * 12/2010  ......... H03K 5/15013
(Continued)

OTHER PUBLICATIONS

Casper et al., Clocking_Analysis_Implementation_and_Measurement_Techniques_for_High-Speed_Data_LinksA_Tutorial, IEEE, Jan. 2009 (Year: 2009).*
(Continued)

*Primary Examiner* — Berhanu Tadese
(74) *Attorney, Agent, or Firm* — NICHOLSON DE VOS WEBSTER & ELLIOTT LLP

(57) ABSTRACT

A quadrature clock generator that takes advantage of the inherently low delay of a shunt-series inductively peaked clock buffer to generate quadrature clocks with the high jitter performance using just one additional stage in Q path compared to I path. The generator includes a delay cell that uses shunt-series peaking and uses a resistive DAC in series with the shunt inductor to provide a large delay range with good jitter characteristics. The resistive DAC can be placed near a real or a virtual ground to minimize capacitive loading on the signal path. This delay cell can provide greater than 2× delay tuning range and is suitable for clocks at high (Continued)

frequencies. This delay cell can also be used as a ring oscillator with large frequency tuning range. A low voltage differential signaling termination switch control that uses feed forward mechanism to control termination impedance of device in a receiver.

21 Claims, 15 Drawing Sheets

(51) Int. Cl.
*H03L 7/087* (2006.01)
*H04L 7/00* (2006.01)

(56) References Cited

U.S. PATENT DOCUMENTS

| | | | | |
|---|---|---|---|---|
| 5,581,207 A * | 12/1996 | Bazes | H03K 5/133 | 327/261 |
| 5,808,498 A * | 9/1998 | Donnelly | H03H 11/18 | 327/344 |
| 6,075,388 A * | 6/2000 | Dalmia | H03L 7/087 | 327/12 |
| 6,208,181 B1 * | 3/2001 | Johnson | H03L 7/081 | 331/25 |
| RE37,452 E * | 11/2001 | Donnelly | H03L 7/0812 | 327/344 |
| 6,518,806 B2 * | 2/2003 | Johnson | H03L 7/081 | 331/25 |
| 6,748,027 B1 * | 6/2004 | Kocaman | H04L 7/033 | 375/373 |
| 7,245,682 B2 * | 7/2007 | Hsu | H04L 7/0338 | 375/375 |
| 7,349,507 B2 * | 3/2008 | Maddux | H03L 7/0814 | 375/355 |
| 7,403,584 B2 * | 7/2008 | Koenenkamp | H03L 7/0998 | 375/354 |
| 7,498,889 B2 * | 3/2009 | Altmann | H03L 7/0812 | 327/5 |
| 7,521,976 B1 * | 4/2009 | Sudjian | H03K 3/012 | 327/201 |
| 7,545,194 B2 * | 6/2009 | Chen | H03K 5/13 | 327/563 |
| 8,258,837 B2 * | 9/2012 | Mosalikanti | H03L 7/0812 | 327/158 |
| 8,259,888 B2 * | 9/2012 | Hua | H03L 7/07 | 455/208 |
| 8,451,969 B2 * | 5/2013 | Jiang | H04L 7/0087 | 327/158 |
| 8,594,603 B2 * | 11/2013 | Balankutty | H04B 1/12 | 455/283 |
| 8,760,209 B2 * | 6/2014 | Schell | H03H 7/06 | 327/239 |
| 8,928,369 B1 * | 1/2015 | Jaeger | H03K 5/15006 | 331/74 |
| 8,982,939 B2 * | 3/2015 | Song | H03H 11/20 | 375/232 |
| 9,048,789 B2 * | 6/2015 | Issakov | H03F 1/0283 | |
| 9,049,001 B2 * | 6/2015 | Jiang | H04L 7/0087 | |
| 9,093,971 B2 * | 7/2015 | Aw | H04L 25/0276 | |
| 9,209,821 B2 * | 12/2015 | Bichan | H03L 7/0998 | |
| 9,281,787 B2 * | 3/2016 | Issakov | H03F 1/0283 | |
| 9,350,528 B2 * | 5/2016 | Song | H03H 11/20 | |
| 9,374,250 B1 * | 6/2016 | Musah | H04L 25/14 | |
| 9,407,229 B2 * | 8/2016 | Aw | H03G 3/341 | |
| 9,501,073 B2 * | 11/2016 | Petrov | G05F 1/56 | |
| 9,602,314 B1 * | 3/2017 | Chang | H04L 25/0292 | |
| 9,674,025 B2 * | 6/2017 | Dickson | H04L 27/01 | |
| 9,698,764 B2 * | 7/2017 | Neidengard | H03K 23/588 | |
| 9,794,089 B2 * | 10/2017 | Musah | H04L 7/0087 | |
| 9,876,667 B2 * | 1/2018 | Dickson | H04L 27/01 | |
| 9,998,125 B2 * | 6/2018 | Balamurugan | H03L 7/00 | |
| 10,148,257 B1 * | 12/2018 | Lin | H03K 5/08 | |
| 10,171,281 B2 * | 1/2019 | Dickson | H04L 27/364 | |
| 10,237,052 B1 * | 3/2019 | Moscone | H03L 7/081 | |
| 10,326,636 B1 * | 6/2019 | Kuo | H05K 1/0298 | |
| 10,361,659 B2 * | 7/2019 | Henzler | H03F 1/0227 | |
| 10,444,785 B2 * | 10/2019 | Abramzon | H03K 5/01 | |
| 10,756,931 B2 * | 8/2020 | Musah | H04L 7/0334 | |
| 10,784,845 B2 * | 9/2020 | Doppalapudi | H03K 5/135 | |
| 10,855,226 B1 * | 12/2020 | Han | H03D 7/1466 | |
| 10,868,663 B1 * | 12/2020 | Turker Melek | H04L 7/0004 | |
| 11,063,595 B1 * | 7/2021 | Zhang | H04B 1/38 | |
| 11,205,826 B2 * | 12/2021 | Nagulu | H03D 7/1441 | |
| 11,258,408 B2 * | 2/2022 | Henzler | H02M 3/158 | |
| 11,489,705 B1 * | 11/2022 | Casey | H04L 25/03038 | |
| 11,777,702 B2 * | 10/2023 | Doppalapudi | H04B 10/50 | 375/296 |
| 2002/0140486 A1 * | 10/2002 | Boerstler | H03L 7/0995 | 327/291 |
| 2004/0071227 A1 * | 4/2004 | Lee | H04L 7/0337 | 375/308 |
| 2004/0087272 A1 * | 5/2004 | Franca-Neto | H03B 27/00 | 455/21 |
| 2006/0269014 A1 * | 11/2006 | Li | H03B 5/1271 | 375/327 |
| 2007/0052467 A1 * | 3/2007 | Cao | H03K 5/07 | 327/280 |
| 2014/0159775 A1 * | 6/2014 | Feng | H03L 7/087 | 327/236 |
| 2014/0292400 A1 * | 10/2014 | Kuo | H03L 7/0816 | 327/553 |
| 2017/0019112 A1 * | 1/2017 | Li | H04L 7/0012 | |
| 2018/0123575 A1 * | 5/2018 | Huang | H03K 21/026 | |
| 2018/0234358 A1 * | 8/2018 | Jakubov | H04W 4/80 | |
| 2018/0278213 A1 * | 9/2018 | Henzler | H03F 3/195 | |
| 2019/0058441 A1 * | 2/2019 | Shiraishi | H03B 5/1209 | |
| 2019/0081630 A1 * | 3/2019 | Li | H03L 7/00 | |
| 2019/0286186 A1 * | 9/2019 | Abramzon | G06F 1/06 | |
| 2019/0312756 A1 * | 10/2019 | Musah | H04L 25/03057 | |
| 2020/0014335 A1 * | 1/2020 | Henzler | H03F 3/245 | |
| 2020/0106429 A1 * | 4/2020 | Doppalapudi | H03K 5/1565 | |
| 2020/0295765 A1 * | 9/2020 | Agrawal | H03L 7/083 | |
| 2021/0006238 A1 * | 1/2021 | Doppalapudi | H03K 5/135 | |
| 2021/0135647 A1 * | 5/2021 | Mao | H04B 1/44 | |
| 2021/0242552 A1 * | 8/2021 | Nagulu | H03D 7/165 | |
| 2022/0147482 A1 * | 5/2022 | Kim | H03K 17/6872 | |
| 2022/0171718 A1 * | 6/2022 | Kundu | H03K 17/6872 | |
| 2022/0200781 A1 * | 6/2022 | Kundu | H04L 7/0025 | |
| 2022/0376958 A1 * | 11/2022 | Kang | H04L 25/4917 | |
| 2023/0006760 A1 * | 1/2023 | Li | H04B 10/524 | |
| 2023/0143414 A1 * | 5/2023 | De Vreede | H03K 17/162 | 327/408 |
| 2024/0103564 A1 * | 3/2024 | Chun | G06F 1/12 | |

FOREIGN PATENT DOCUMENTS

| | | | | |
|---|---|---|---|---|
| CN | 101931398 B | * | 7/2012 | ......... H03K 5/15013 |
| CN | 102710239 A | * | 10/2012 | |
| CN | 103701438 A | * | 4/2014 | ............ H03B 27/00 |
| CN | 103986439 A | * | 8/2014 | |
| CN | 105703767 A | * | 6/2016 | ............ H03L 7/0807 |
| CN | 103701438 B | * | 7/2016 | ............ H03B 27/00 |
| CN | 106067814 A | * | 11/2016 | ............ H03L 7/099 |
| CN | 106100585 A | * | 11/2016 | ............ H03B 27/00 |
| CN | 106130654 A | * | 11/2016 | ............ H04B 10/516 |
| CN | 107070824 A | * | 8/2017 | ............ H03K 5/134 |
| CN | 107124154 A | * | 9/2017 | ............ H03H 11/16 |
| CN | 102710239 B | * | 12/2017 | |
| CN | 108023578 A | * | 5/2018 | ........... H03K 21/026 |
| CN | 106130654 B | * | 6/2018 | ............ H04B 10/516 |
| CN | 105703767 B | * | 10/2018 | ............ H03L 7/0807 |
| CN | 106067814 B | * | 12/2018 | ............ H03L 7/099 |
| CN | 106100585 B | * | 1/2019 | ............ H03B 27/00 |
| CN | 109343058 A | * | 2/2019 | ............ G01S 13/90 |
| CN | 109343059 A | * | 2/2019 | ............ G01S 13/90 |
| CN | 109687839 A | * | 4/2019 | ............ H03H 11/16 |
| CN | 110277989 A | * | 9/2019 | ............ G06F 1/06 |
| CN | 110417432 A | * | 11/2019 | ............ H01F 19/00 |
| CN | 109343058 B | * | 12/2019 | ............ G01S 13/90 |
| CN | 110530248 A | * | 12/2019 | ............ G01B 7/02 |

(56) References Cited

FOREIGN PATENT DOCUMENTS

| | | | | |
|---|---|---|---|---|
| CN | 111726096 A | * | 9/2020 | |
| CN | 110530248 B | * | 6/2021 | ............... G01B 7/02 |
| CN | 111551849 B | * | 6/2021 | ........... G01R 31/343 |
| CN | 107070824 B | * | 7/2021 | .............. H03K 5/134 |
| CN | 107124154 B | * | 9/2021 | .............. H03H 11/16 |
| CN | 113438787 A | * | 9/2021 | |
| CN | 113452345 A | * | 9/2021 | |
| CN | 113572453 A | * | 10/2021 | |
| CN | 110277989 B | * | 12/2021 | ............... G06F 1/06 |
| CN | 113572453 B | * | 1/2022 | |
| CN | 110417432 B | * | 2/2022 | ............. H01F 19/00 |
| CN | 114257212 A | * | 3/2022 | |
| CN | 114520633 A | * | 5/2022 | |
| CN | 113452345 B | * | 6/2022 | |
| CN | 115462010 A | * | 12/2022 | ............. H04B 10/50 |
| DE | 102013110222 A1 | * | 3/2014 | ............. H03B 27/00 |
| DE | 102014108156 A1 | * | 12/2014 | ............. H04L 7/033 |
| DE | 102013110222 B4 | * | 10/2015 | ............. H03B 27/00 |
| DE | 112013007457 T5 | * | 6/2016 | ............... G06F 1/04 |
| DE | 112013007457 B4 | * | 9/2018 | ............... G06F 1/04 |
| EP | 1146642 A2 | * | 10/2001 | .............. H03H 11/18 |
| EP | 1146643 A2 | * | 10/2001 | .............. H03H 11/18 |
| EP | 1146642 B1 | * | 12/2006 | .............. H03H 11/18 |
| EP | 3540945 A1 | * | 9/2019 | ............... G06F 1/06 |
| EP | 4167488 A1 | * | 4/2023 | ............. H03B 27/00 |
| GB | 2429590 A | * | 2/2007 | .............. H03K 5/133 |
| GB | 2498949 A | * | 8/2013 | .............. H03K 5/135 |
| JP | 2019161651 A | * | 9/2019 | ............... G06F 1/06 |
| TW | 202007094 A | * | 2/2020 | ............. H01F 19/00 |
| WO | WO-9637952 A1 | * | 11/1996 | .............. H03H 11/18 |
| WO | WO-2015041645 A1 | * | 3/2015 | ........... H03K 23/588 |
| WO | WO-2015076789 A1 | * | 5/2015 | ............... G06F 1/04 |
| WO | WO-2015112288 A1 | * | 7/2015 | ............. H03B 27/00 |
| WO | WO-2020068533 A1 | * | 4/2020 | .............. H03K 5/05 |
| WO | WO-2021105672 A1 | * | 6/2021 | ........... H04B 10/524 |
| WO | WO-2021187986 A1 | * | 9/2021 | ........... H03K 17/145 |
| WO | WO-2023046109 A1 | * | 3/2023 | |

OTHER PUBLICATIONS

Chen et al. A_32Gb_s_NRZ_Wireline_Transmitter_with_CMFB-_Based_CML_Driver_in_28nm_CMOS_Technology, IEEE Sep. 2021 (Year: 2021).*

Kim et al. A_224-Gb_s_DAC-Based_PAM-4_Quarter-Rate_Transmitter_With_8-Tap_FFE, IEEE Jan. 2022 (Year: 2022).*

Geoffrey Hunter, Digital-to-Analog Converters (DACs), Published Nov. 2020 (Year: 2020).*

Chen et al., A_5064_Gb_s_Serializing_Transmitter_With_a_4-Tap_LC-Ladder-Filter-Based_FFE_in_65_nm_CMOS_Technology, IEEE, Aug. 2015 (Year: 2015).*

Kim et al. A_112_Gb_s_PAM-4_56_Gb_s_NRZ_Reconfigurable_Transmitter_With_Three-Tap_FFE_in_10-nm_FinFET, IEEE, Jan. 2019 (Year: 2019).*

Lin et al. A_50_Gb_s_PAM-4_Transmitter_With_Feedforward_Equalizer_and_Background_Phase_Error_Calibration, IEEE, Augurst 2021 (Year: 2021).*

Roopkom et al. Analysis_of_Series-shunt_Peaking_network_for_CMOS_Cascaded_Amplifiers, IEEE 2006 (Year: 2006).*

V. Riess et al. A_3-Bit_DAC_With_Gray_Coding_for_100-Gbit_s_PAM_Signal_Generation, IEEE Aug. 2020 (Year: 2020).*

Casper, et al., "Clocking Analysis, Implementation and Measurement Techniques for High-Speed Data Links—A Tutorial", IEEE Transactions on Circuits and Systems I: Regular Papers, vol. 56, No. 1, pp. 17-39, Jan. 2009, doi: 10.1109/TCSI.2008.931647.

Chen, Ming-Shuan et al., "A 50-64 GB/s Serializing Transmitter With a 4-Tap, LC-Ladder-Filter-Based FFE in 65 nm CMOS Technology", IEEE Journal of Solid-State Circuits, vol. 50, No. 8, Aug. 2015, 14 pgs.

Toprak-Deniz, Zeynep et al., "A 128-GB/s 1.3-pJ/b PAM-4 Transmitter With Reconfigurable 3-Tap FFE in 14-nm CMOS", IEEE Journal of Solid-State Circuits, vol. 55, No. 1, Jan. 2020, 8 pgs.

* cited by examiner

WIDE-RANGE INDUCTOR-BASED DELAY-CELL AND AREA EFFICIENT TERMINATION SWITCH CONTROL

CLAIM OF PRIORITY

This application claims priority of U.S. Provisional Application Ser. No. 63/127,956 titled "WIDE-RANGE INDUCTOR-BASED DELAY-CELL AND AREA EFFICIENT TERMINATION SWITCH CONTROL," filed Dec. 18, 2020, which is incorporated by reference in its entirety.

BACKGROUND

Long-reach wireline serial IO (e.g., serializer-deserializer (SerDes)) with per-pin data-rate of 112 G-PAM4 (pulse amplitude modulation with 4 amplitude levels) and achieving 1-1.5 pJ/bit energy efficiency is already in deployment in the industry. Next-generation 224 G-PAM4 is currently under development. Quarter-rate clocking architecture for a SerDes transmitter (TX) is a common choice at these baud rates to reduce overall power consumption and achieve good jitter performance This means that while a 112 G-PAM4 (56 Gbaud) quarter-rate PAM4 SerDes TX can use 14 GHz clocks, for 224 G-PAM4 (112 Gbaud) 28 GHz clocks are needed to propagate from a voltage-controlled oscillator (VCO) to the TX's one unit-interval (1-UI) pulse generators (pulsegen). Here, PAM4 refers to 4-level Pulse Amplitude Modulation. Since 1-UI (one unit interval) duration is halved in the 224 G-PAM4 case compared to previous 112 G-PAM4, jitter specification (both random and deterministic) also needs to improve by roughly 2× to achieve similar eye margins. A significant portion of the high-frequency random jitter (RJ) comes from thermal-noise-induced jitter in the clock buffers.

To first order, 4× higher power is needed to reduce this random jitter (RJ) by 2×, all else remaining constant (in reality, this factor is much higher than 4× due to severe jitter amplification seen at 28 GHz clock buffers). Also, a 2× clock frequency uses nominally 2× clocking power ($CV^2f$, where C is capacitance, V is voltage, and f is frequency. This means that moving from 112 G-PAM4 to 224 G-PAM4 entails 8× or even higher clocking power, thus, blowing up the overall energy efficiency budget which remains at 1.5 pJ/bit in 224 G case for the TX (clocking usually amounts to about 50% of this number). So, meeting the jitter specification at 224 G-PAM4 operation with similar energy efficiency of a 112 G-PAM4 TX is a challenge.

In addition to the above challenges, SerDes standards use multiple clock frequencies ranging from near DC to the highest clock frequency (e.g., 28 GHz) for efficient multi data-rate operation. In a typical SerDes clock distribution scheme, multiple phase locked loops (PLLs) are used. These PLLs also need to have divided clock paths that are used to support a continuous, hole free clock frequency span. As a result, a quadrature generator (Quadgen) present in the high-frequency (HF) path needs to support one-octave e.g., 16-32 GHz operation. This means the extra delay in the Q-path needs to be varied from 7.81 ps (for 32 GHz) to 15.62 ps (for 16 GHz). To create this large variable delay while meeting the stringent jitter target at 32 GHz is an extremely challenging task.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
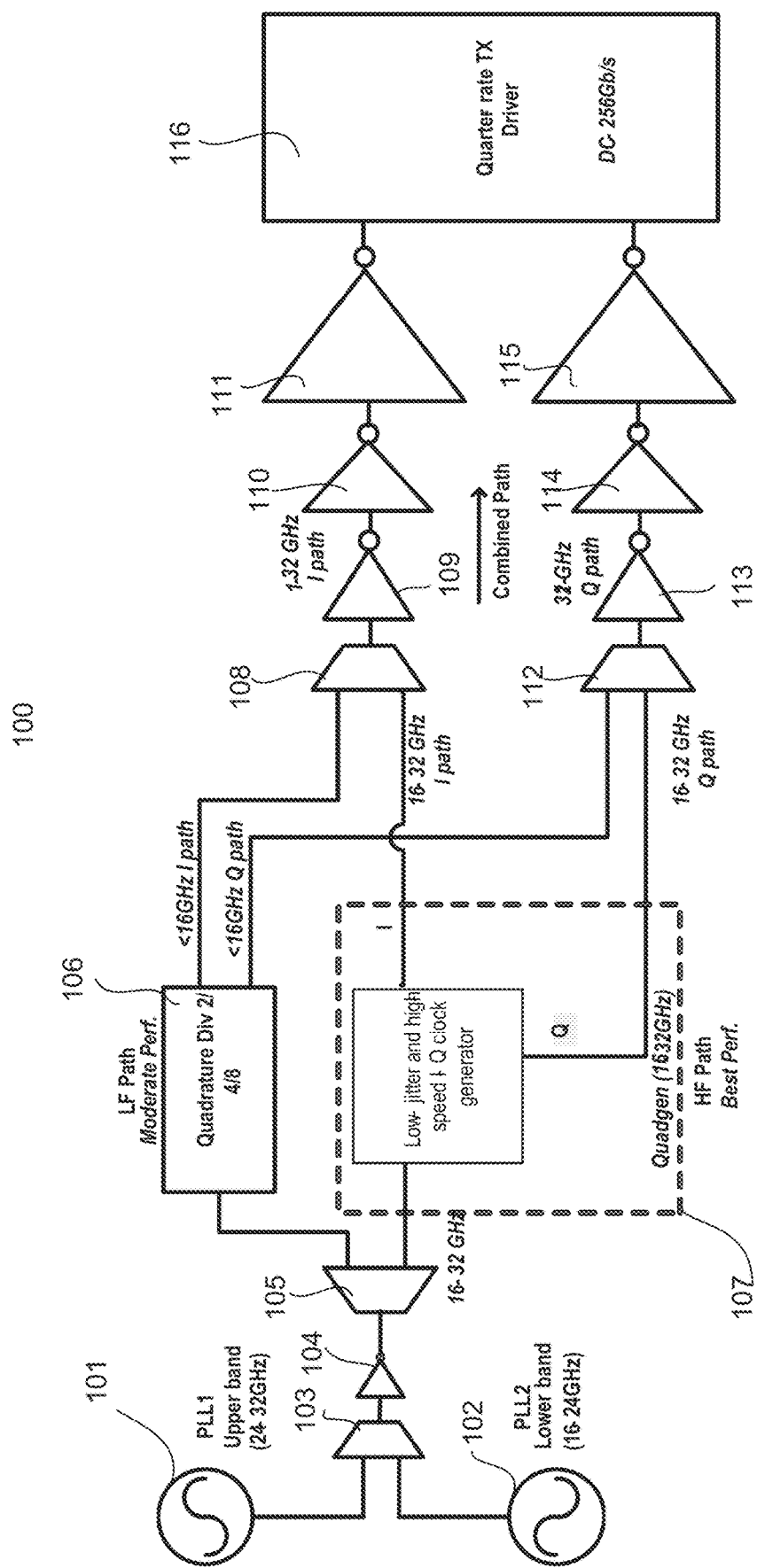
FIG. 1 illustrates clock distribution 100 for serial-deserializer (SerDes) transmitter (Tx) with low-jitter quadrature clock generator, in accordance with some embodiments.

Some embodiments provide a quadrature clock generator that takes advantage of the inherently low delay of a shunt-series inductively peaked clock buffer to generate quadrature clocks (e.g., at 32 GHz) with the high jitter performance using just one additional stage in Q path compared to I path. Some embodiments use a switch resistance digital-to-analog converter (DAC) at the virtual ground node of the shunt inductor to turn its delay reduction effect gradually off. As such, the quadrature clock generator is able to generate quadrature clocks at all frequencies down to a much lower frequency (e.g., 16 GHz) with acceptable jitter performance Some embodiments describe a delay cell that uses shunt-series peaking and uses a resistive DAC in series with the shunt inductor to provide a large delay range with good jitter characteristics. The resistive DAC can be placed near a real or a virtual ground to minimize capacitive loading on the signal path. This delay cell can provide greater than 2× delay tuning range and is suitable for clocks at high frequencies (e.g., up to 32 GHz). This delay cell can be used to generate low-jitter I-Q clocks with just a delay stage or in a ring oscillator with large frequency tuning range.

In some embodiments, an apparatus (e.g., a clock buffer) is provided which comprises a first driver to receive a first input and having a first output; and a second driver to receive a second input and having a second output, wherein the first input is complementary of the second input. In some embodiments, the apparatus comprises a first shunt-series set of inductors coupled to the first output. In some embodiments, the apparatus comprises a second shunt-series set of inductors coupled to the second output, wherein the first shunt-series set of inductors is coupled to the second shunt-series set of inductors via a resistor based digital-to-analog converter (R-DAC). In some embodiments, the apparatus comprises a memory element coupled to the first output and the second output. In some embodiments, the memory element comprises cross-coupled inverters. In some embodiments, the cross-coupled inverters are about eight times smaller than the first driver or the second driver. In some embodiments, the R-DAC is operable to adjust jitter and delay of the apparatus. In some embodiments, the R-DAC is controlled by a digital code, wherein the digital code resulting in a smallest resistance of the R-DAC causes the apparatus to provide shortest propagation delay and lowest jitter. In some embodiments, the R-DAC is controlled by a digital code, wherein the digital code resulting in a highest resistance of the R-DAC causes the apparatus to provide longest propagation delay and highest jitter. In some embodiments, the first driver comprises a first inverter, and wherein the second driver comprises a second inverter. In some embodiments, the first and second drivers are power gated. In some embodiments, the first shunt-series set of inductors comprises: a first inductor coupled in series between the first output and a third output; and a second inductor coupled with the first output and a node that provides a common mode voltage. In some embodiments, the second shunt-series set of inductors comprises: a third inductor coupled in series between the second output and a fourth output; and a fourth inductor coupled with the second output and the node.

In some embodiments, an apparatus (e.g., an oscillator) is provided which comprises a first differential clock buffer with shunt-series set of inductors. The apparatus further comprises a second differential clock buffer with shunt-series set of inductors, wherein the first differential clock buffer is coupled to the second differential clock buffer such that an output of the second differential clock buffer is coupled to an input of the first differential clock buffer. In various embodiments, the first or second differential clock buffer is according to the various clock buffers described herein.

Some embodiments describe an apparatus comprising a termination scheme which includes a termination device operable to provide termination impedance. The apparatus further comprises a circuitry to control the termination device, wherein the circuitry comprises feed forward mechanism that provides common mode, process, and temperature tracking to control the termination device. In some embodiments, the apparatus comprises first and second devices that are cross-coupled, wherein one of first or second device is coupled to a drain terminal of the termination device. In some embodiments, the apparatus comprises a third device coupled to the first and second devices. In some embodiments, the apparatus comprises a fourth device coupled in series to the third device, wherein the fourth device is diode connected, wherein the fourth device is coupled to a gate of the termination device. In some embodiments, the apparatus comprises a fifth device coupled in series with the third device, wherein the fifth device is diode connected. In some embodiments, the apparatus comprises a current source coupled to the termination device and fourth device.

There are many technical effects of various embodiments. For example, the delay cell enables high-speed and low-jitter clock distribution. The delay cell thus allows for robust, energy efficient 224-256 Gb/s transceivers. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

FIG. 1 illustrates clock distribution 100 for serial-deserializer (SerDes) transmitter (Tx) with low-jitter quadrature clock generator, in accordance with some embodiments. Clock distribution 100 comprises a first phase locked loop (PLL1) 101 to generate an upper band clock (e.g., 24-32 GHz), a second PLL (PLL2) 102 to generate a lower band clock (e.g., 16-24 GHz), multiplexer 103, buffer or inverter 104, demultiplexer 105, first quadrature generator 106 (e.g., for low frequency (LF) or moderate performance path), second quadrature generator 107 (e.g., for high frequency (HF) or best performance path), in-phase or I path comprising multiplexer 108 and progressively upsized drivers 109, 110, and 111, Quadrature phase or Q path comprising multiplexer 112 and progressively upsized drivers 113, 114, and 115, and driver (e.g., quarter rate transmitter). The outputs of the driving buffer (e.g., 111 and 115) is used to drive a load (e.g., Quarter-rate TX driver).

After obtaining the clock from a voltage-controlled oscillator (VCO) of PLLs 101 and 102, certain clock manipulation functions are performed, such as multiphase generation duty cycle and phase correction, before fanning up the clock to drive the final large load of the Tx pulse generators. The smaller buffers or inverters typically used in the early stages clock distribution 100 generate most of the thermal-noise-induced random jitter while all the subsequent stages amplify their incoming random jitter (RJ) in addition to adding their own thermal noise induced jitter.

In some embodiments, second quadrature generator 107, for high frequency (HF) or best performance path, comprises a delay cell that uses shunt-series peaking and uses a resistive digital-to-analog converter (DAC) in series with the shunt inductor to provide a large delay range with good jitter characteristics. The resistive DAC can be placed near a real or a virtual ground to minimize capacitive loading on the signal path. This delay cell can provide greater than 2× delay tuning range and is suitable for clocks at high frequencies (e.g., up to 32 GHz).

Figure 2A:
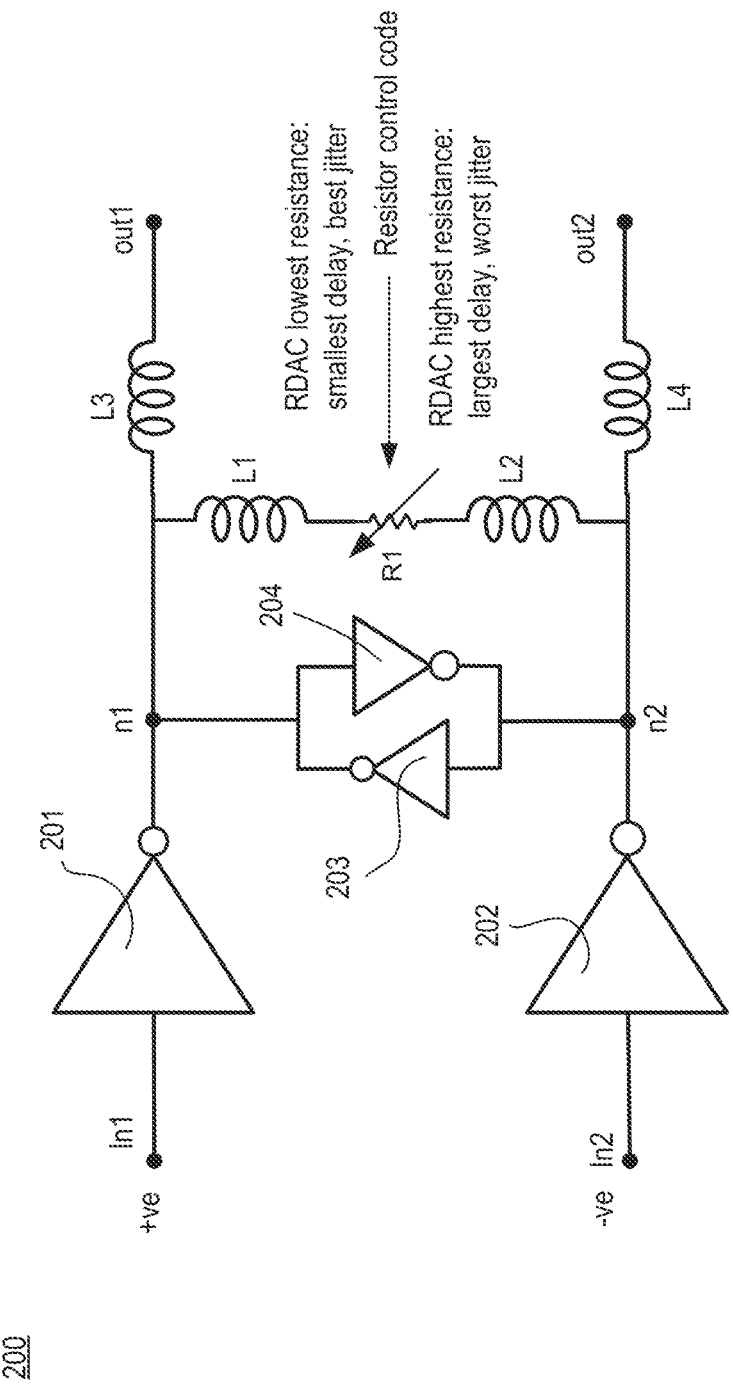
FIG. 2A illustrates a shunt-series inductively peaked clock buffer with resistor digital-to-analog converter (DAC) for use in low-jitter quadrature clock generator, in accordance with some embodiments.

FIG. 2A illustrates a shunt-series inductively peaked clock buffer 200 with resistor digital-to-analog converter (DAC) for use in low-jitter quadrature clock generator, in accordance with some embodiments. Buffer 200 can be used for implementing buffer 104. Other buffers in clock buffer 200 can also be implemented using buffer 200. Buffer 200 comprises inverters 201, 202, 203, and 204, shunt inductors L1 and L2, series inductors L3 and L4, and switch R-DAC (R1) coupled as shown. While the embodiment illustrates a differential clock buffer having inputs In1 and In2 (where In2 is complementary of In1) and differential outputs out1 and out2 (where out2 is complementary of out1), the embodiments are applicable to single-ended clock buffer too.

In some embodiments, the inductance of inductors L1 and L2 is higher than the inductances of inductors L3 and L4. For example, inductance of L1 is 3× higher than inductance of L3. In various embodiments, the series inductors L3 and L4 provide extra peaking. In some embodiments, inverters 201 and 202 are power gated. In some embodiments, a memory element comprising inverters 203 and 204 are smaller than inverters 201 and 202. For example, inverters 203 and 204 are 8× smaller than inverters 201 and 202. In various embodiments, the memory element maintains good common mode voltage on nodes n1 and n2. In some embodiments, the cross-coupling set of inverters 203 and 204 that form the memory element are removed.

Buffer 200 is a delay element with inductive shunt peaking that is tuned with a series R-DAC to control the delay. Adding a series-peaking inductor increases the maximum delay of buffer 200. Other tuning elements like a capacitor DAC can also be added to the delay element, in accordance with some embodiments. This delay cell provides wide tuning range, high bandwidth and low jitter. It can be applied to a number of applications. The ones described herein are: and (1) Very wide frequency range (one-octave) quadrature clock generator i.e. generating 4-phases (e.g., 0, 90, 180 and 270 degrees) from two input phases (0 and 180 degrees), and (2) Very wide frequency range quadrature oscillator (direct 4-phase generation). They both function using the same underlying principal which is detailed herein. The clock buffer can also be used in other situations such as clock distribution network. In some embodiments, when the RDAC is set (by resistor control code) to lowest resistance, buffer 200 results in the smallest delay and best jitter performance (i.e., lowest jitter). In some embodiments, when the RDAC is set (e.g., by a resistor control code) to highest resistance, buffer 200 results in the largest delay and worst jitter performance (i.e., highest jitter).

In some embodiments, the presence of the shunt inductor in a shunt-series peaked amplifier, introduces zero (complex zero) in its voltage transfer function. Such a zero provides a phase lead effect. In the context of a shunt-series peaked inverter, this phase lead effect shows up as a delay reduction (Note: "delay" here refers to standard way of measuring CMOS digital gate delay, for example, a time difference between an input rising edge and an output falling edge or a time difference between an input falling edge and an output rising edge). As a result, a shunt-series peaked inverter achieves smaller overall delay, even smaller than a standard inductor-less CMOS inverter at iso fanout. On the other hand, a series peaked inductor-based inverter suffers from larger delay (where the phase lag comes from a complex pole by the series inductor) than a standard CMOS inverter at iso fanout. As a result, there is a big delay jump in series peaked inverter compared to a shunt-series peaked inverter. There are some additional second order effects such as clock frequency compared to actual pole zero locations since the L values in both cases are usually tuned to give best overall jitter performance These second order effects usually widen this delay gap. This is the underlying principal of some embodiments.

Note that a shunt-series peaked clock buffer provides jitter filtering (attenuates incoming jitter) and thus very beneficial for high frequency (e.g., 28-32 GHz) clock distribution regime to meet the jitter specification at a reasonable power level. The series peaked clock buffer on the other hand may not provide the jitter filtering (because it amplifies the incoming jitter) but may still be useful in supporting a higher fanout compared to standard CMOS inverter (where shunt-series configuration supports higher fanout).

Figure 2B:
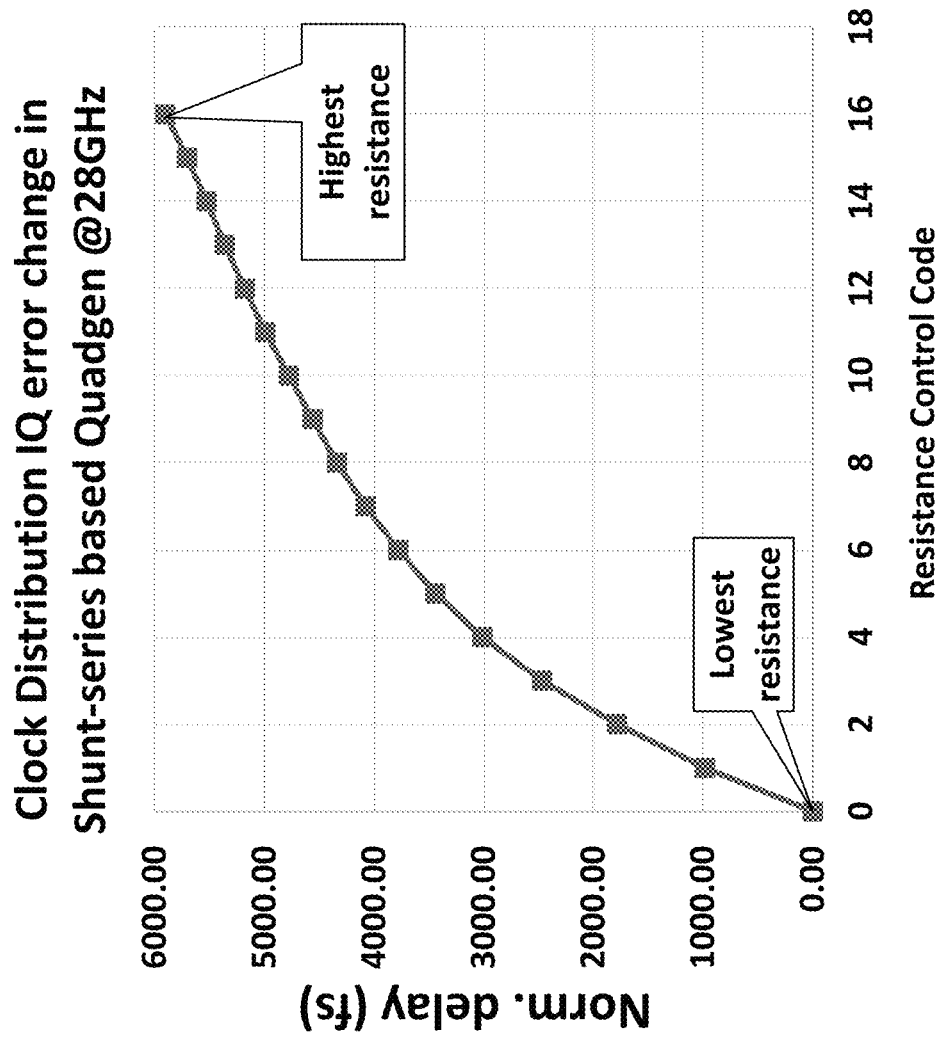
FIG. 2B illustrates a plot showing how a resistor DAC (R-DAC) resistance dependent delay of a shunt-series clock buffer can be exploited in a quadrature generator of FIG. 2A, in accordance with some embodiments.

FIG. 2B illustrates plot 220 showing how a resistor DAC (R-DAC) resistance dependent delay of a shunt-series clock buffer can be exploited in a quadrature generator of FIG. 2A, in accordance with some embodiments. Plot 220 shows the effect when a switch resistance DAC progressively transforms the shunt-series stage to a series peaked stage.

Figure 3:
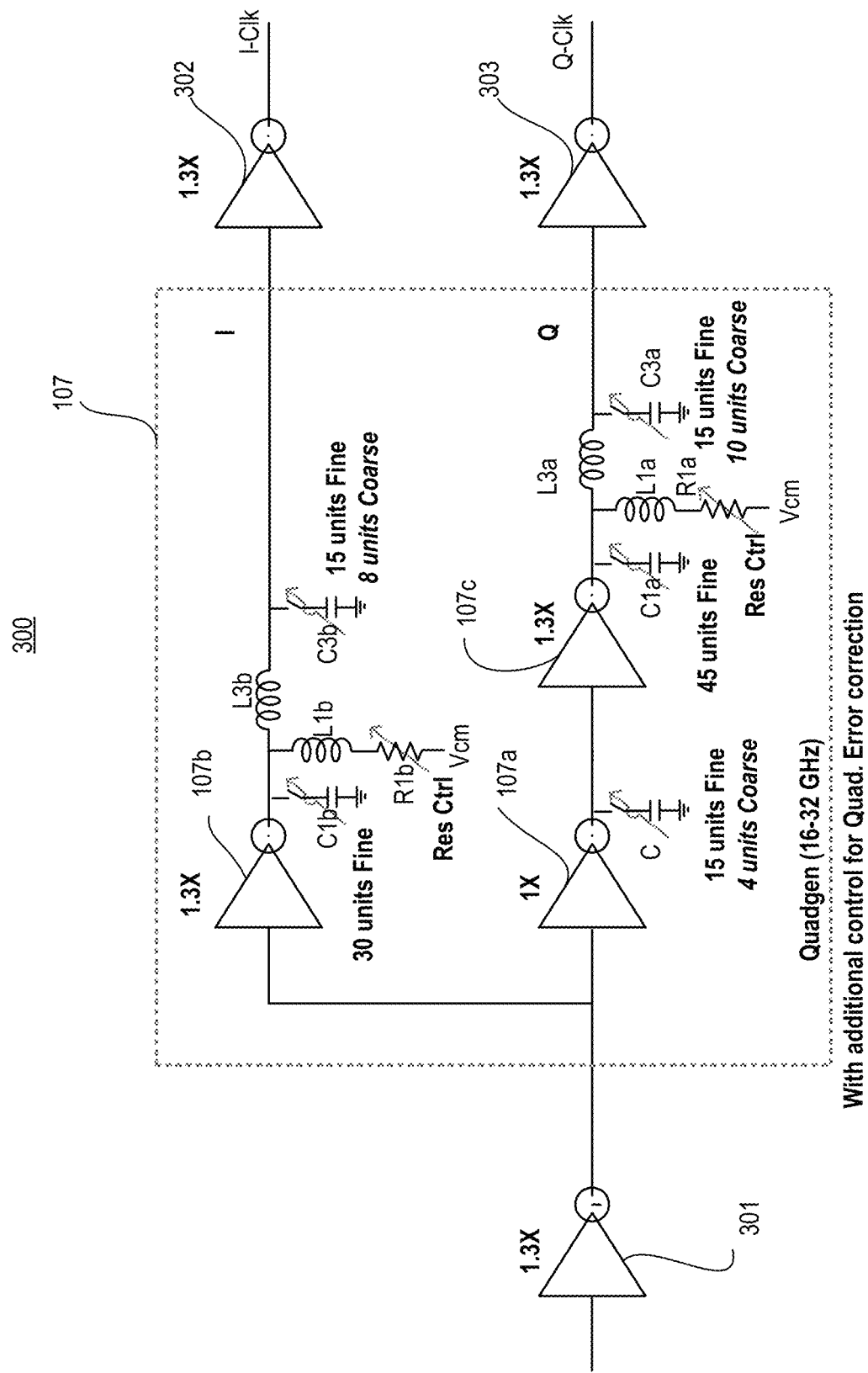
FIG. 3 illustrates an apparatus with one-octave quadrature generator that includes shunt-series peaked inductive clock buffer stages, in accordance with some embodiments.

FIG. 3 illustrates apparatus 300 with one-octave quadrature generator (e.g., 107) that includes shunt-series peaked inductive clock buffer stages, in accordance with some embodiments. Apparatus 300 comprises inverter 301, quadrature generator (Quadgen) 107, and output inverters 302 and 303. In some embodiments, Quadgen 107 comprises circuitry for Q-path and circuitry for I-path. The Q-path generates clock Q-Clk while the I-path generates clock I-Clk. In various embodiments, Q-Clk has a phase difference of substantially 90 degrees relative to I-Clk.

The circuitry for Q-path includes inverter 107a coupled to inverter 301, switch capacitor C to control delay, inverter 107c coupled in series with inverter 107a, switch capacitor C1a, shunt inductor L1a coupled to the output of inverter 107a, R-DAC R1a coupled in series with shunt inductor L1a, series inductor L3a couples in series with inverter 107c, and switch capacitor C3a.

The circuitry for I-path includes inverter 107b coupled to inverter 301, switch capacitor C1b, shunt inductor L1b, R-DAC R1b, series inductor L3a, and switch capacitor C3b. Apparatus 300 illustrates a half quadgen (single-ended quadgen) that generates I-Clk and Q-Clk. For half quadgen, R-DACs R1a and R1b are based to common mode voltage Vcm. Vcm can be half of Vcc (power supply voltage). Any suitable bias generator can generate Vcm. For fully differential quadgen, the other half circuit is coupled to R-DACs instead of Vcm.

The additional inductor-less stage in the Q path, along with small load difference creates the correct delay (e.g., 7.8 ps) between the Q path and I path so as to generate Quadrature clocks at, for example 32 GHz, without using any of the capacitance control cells thereby attaining best jitter performance possible.

Figure 4:
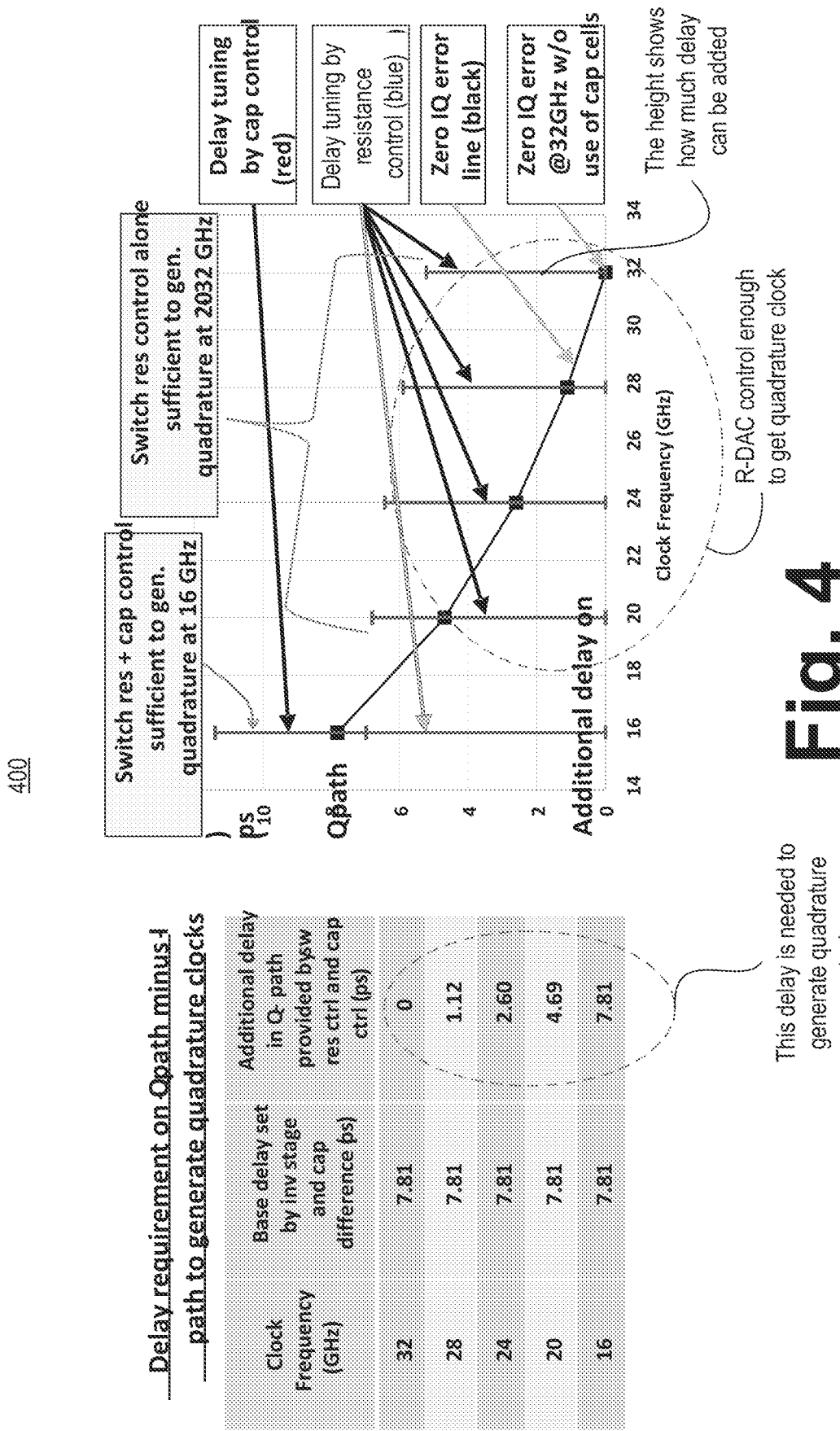
FIG. 4 illustrates a table and a plot showing the role of R-DAC in generating the quadrature clock, in accordance with some embodiments.

FIG. 4 illustrates a table and a plot 400 showing the role of R-DAC in generating the quadrature clock (I-Clk and Q-Clk), in accordance with some embodiments. There are three aspects described herein: (a) shunt-series to series peaked clock buffer delay difference, (b) shunt-series peaked clock buffer providing jitter attenuation and (c) ability of shunt-series and series peaked stages to support more load.

An example herein describes how the embodiments of this invention can be used in the 16-32 GHz (one octave) quadrature generator (Quadgen) apparatus 300. For best jitter performance, the Quadgen is designed to produce quadrature at 32 GHz without applying any of the switched capacitors (C, C1am C1b, C3c) i.e., they are all in the OFF state. This feature of turning off all these switch-capacitors is supported by the aspect (c) mentioned above. To do this, the Q path provides an additional delay of 7.81 ps compared to the I path. The delay of 7.81 ps is provided primarily by inverters 107a and 107c since the switch capacitors C, C1a, and C3a are off.

For other lower clock frequencies down to 16 GHz, the additional delay requirements are listed in the table of FIG. 4. As shown to the right side in FIG. 4, quadrature at other frequencies like 28, 24 and 20 GHz can be generated by just dialing in the switch resistance control alone. For example, RDAC R1a provides the delay needed to generate the correct Q-Clk for different clock frequencies. At 16 GHz, switch capacitance control is also engaged in addition to generate the quadrature clocks. In practice the embodiments budget for more variable delay range than just 7.81 ps to generate quadrature clocks over process, voltage and temperature (PVT) variation in 16-32 GHz range.

Figure 5:
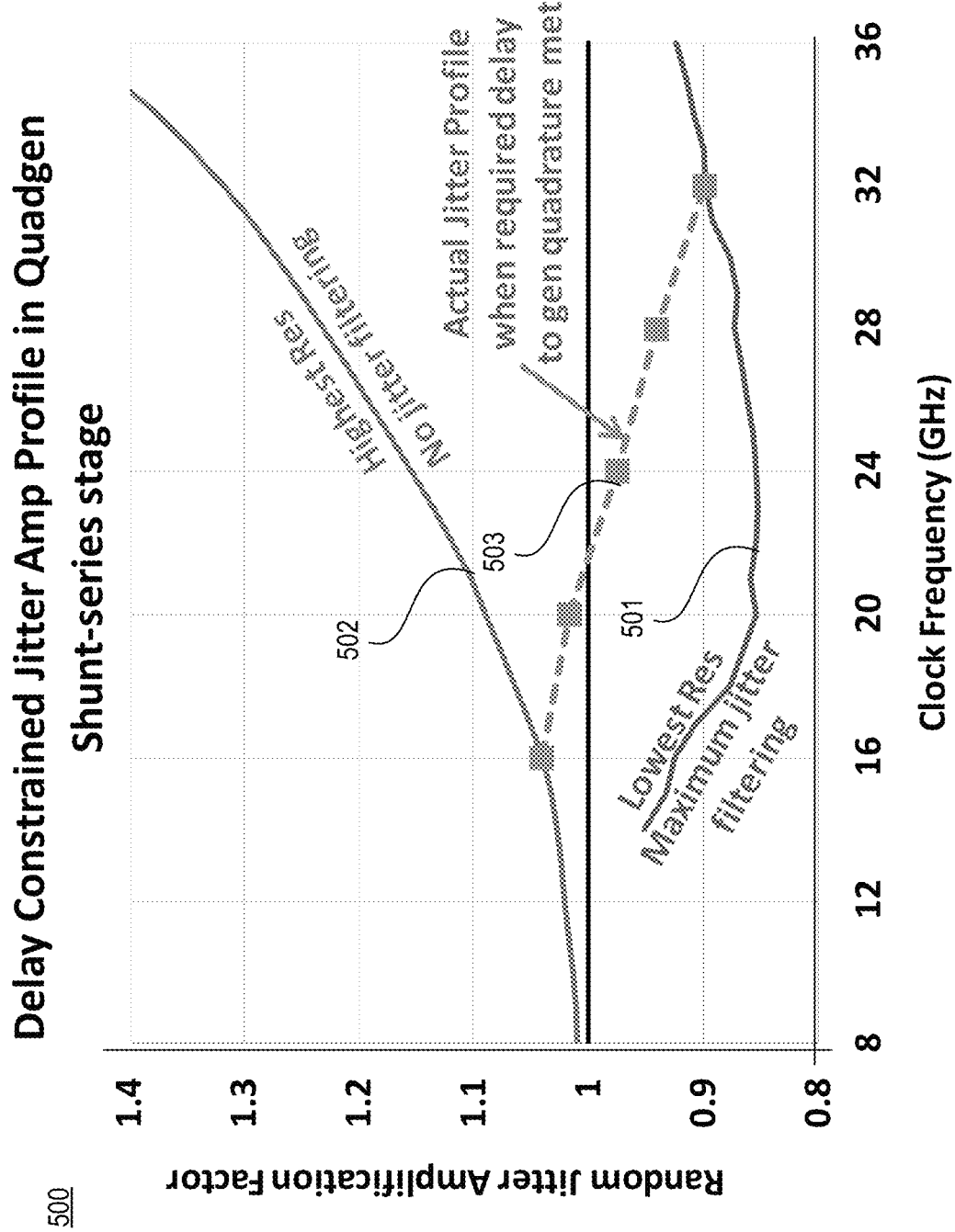
FIG. 5 illustrates a plot showing delay constrained jitter amplifier profile in quadrature generator comprising shut-series stage, in accordance with some embodiments.

FIG. 5 illustrates plot 500 showing delay constrained jitter amplification profile in quadrature generator comprising shut-series stage, in accordance with some embodiments. Plot 500 shows the use of the jitter filtering aspect of the shunt-series stage. When the R-DAC resistance is lowest, the shunt inductor provides jitter attenuation (curve 501, best case jitter amp) and when the R-DAC resistance is highest (no connection, switches fully-OFF), jitter gets amplified (curve 502, worst case jitter amp). This works out nicely here since the Quadgen 107 uses the R-DAC's lowest resistance setting for 32 GHz clock which also has the most stringent jitter budget. When lower clock frequency is used, to generate quadrature clocks, the resistance from R-DAC is increased. As a result, curve 503 is followed. Although jitter amplification increases at lower clock frequencies, it is maintained close to 1 even at the lower frequency bound, in this case 16 GHz. As clock frequency is lowered, the jitter budget also gets progressively relaxed thus the green curve provides similar trend to the actual requirement.

Figure 6:
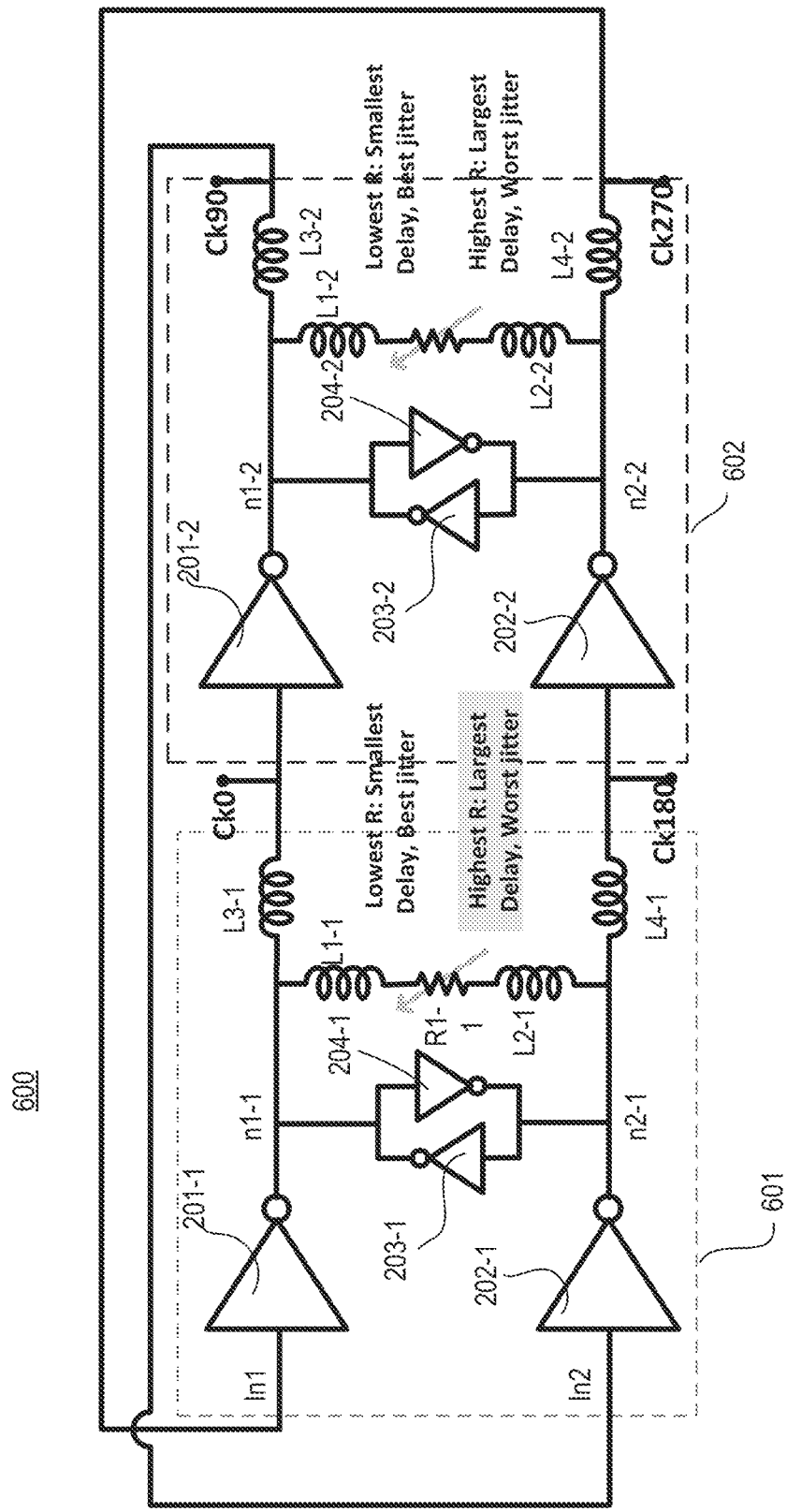
FIG. 6 illustrates an oscillator comprising two shunt-series peaked clock buffer stages, in accordance with some embodiments.

FIG. 6 illustrates oscillator 600 comprising two shunt-series peaked clock buffer stages 601 and 602, in accordance with some embodiments. Each buffer stage is similar to buffer stage 200 of FIG. 2A. Buffer stage 601 comprises inverters 201-1 and 202-1, memory element 203-1 and 204-1, shunt inductors L1-1, L2-1, series inductors L3-1 and L4-1, R-DAC R1-1 coupled as shown. Buffer stage 602 comprises inverters 201-2 and 202-2, memory element 203-2 and 204-2, shunt inductors L1-2, L2-2, series inductors L3-2 and L4-2, and R-DAC R1-2 coupled as shown. The two delay stages are coupled to one another in a cross-coupled fashion. For example, node n2-2 of stage 602 is coupled to node In1 of stage 601 via inductor L4-2, and node n1-2 of stage 602 is coupled node In2 of stage 601 via inductor L3-2. While two buffer states are shown, any number of buffer states (e.g., buffer) 200 can be coupled in series such that the first stage and the last stage are cross-coupled as shown in the embodiment of FIG. 6.

Oscillator 600 has a wide tuning range. It comprises two such shunt-series inductively peaked clock buffer stages that are coupled in series with a positive feedback to close the loop. The arrangement is similar to a ring oscillator using differential stages. Since the amount of the delay in each stage can be tuned over a very wide range, this quadrature oscillator is capable of achieving a very wide tuning range. Note the additional switch capacitor details are not shown in this diagram. Similar to the Quadgen generator 107 of FIG. 3, this arrangement of FIG. 6 also provides the best jitter filtering and thus the best phase noise at its highest operating frequency and worse phase noise at lower clock frequencies. Note that further phase noise improvement is possible when 2f0 filter inductors are added (not shown).

Figure 7:
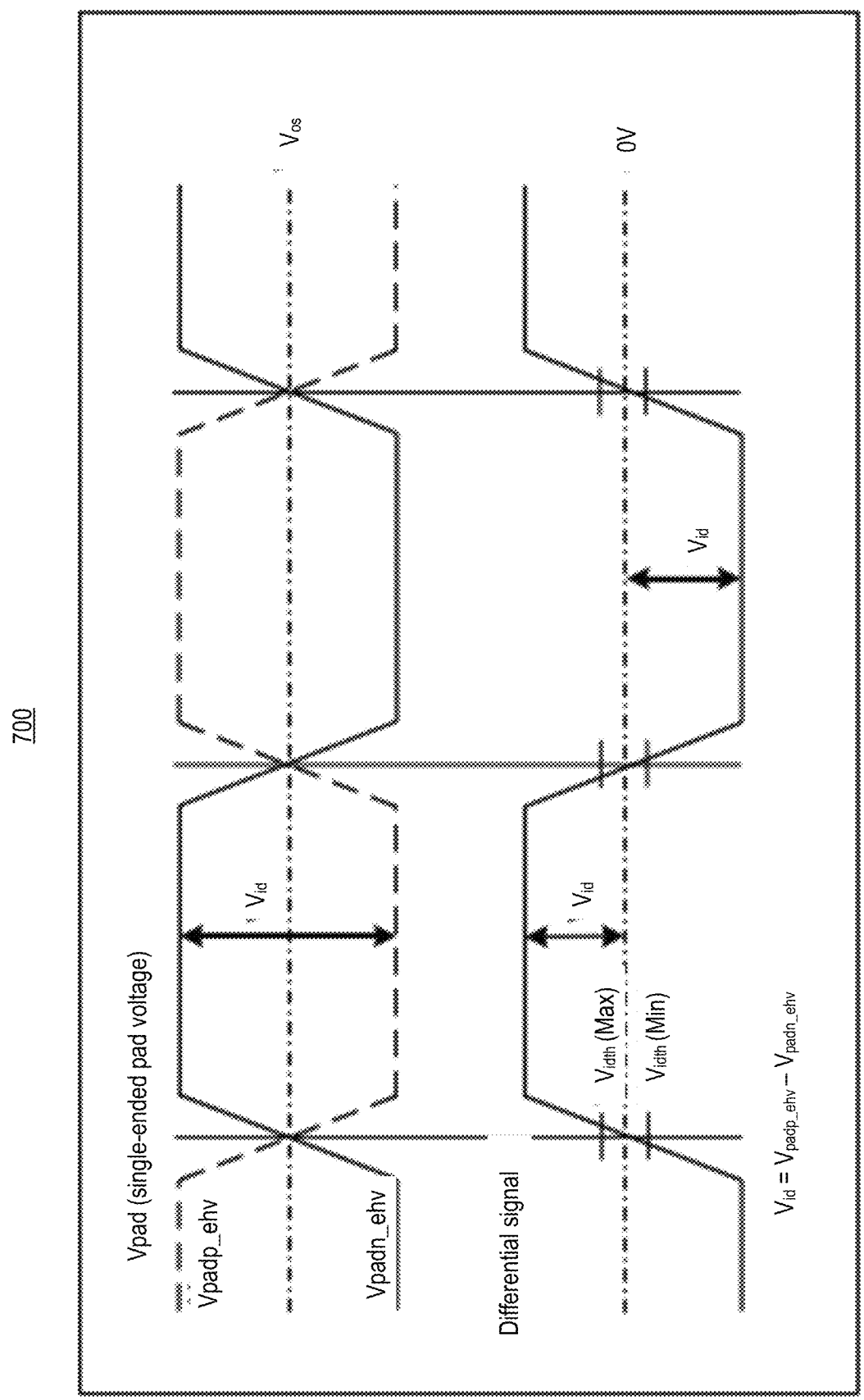
FIG. 7 illustrates a set of plots showing low voltage differential signaling (LVDS) levels for both single-ended and differential signals.

FIG. 7 illustrates a set of plots 700 showing low voltage differential signaling (LVDS) levels for both single-ended and differential signals. The signaling levels for a Low Voltage Differential Signal (LVDS) receiver are shown in FIG. 7 where the input common mode ($V_{os}$ in the figure) is the average voltage across the pads.

Figure 8:
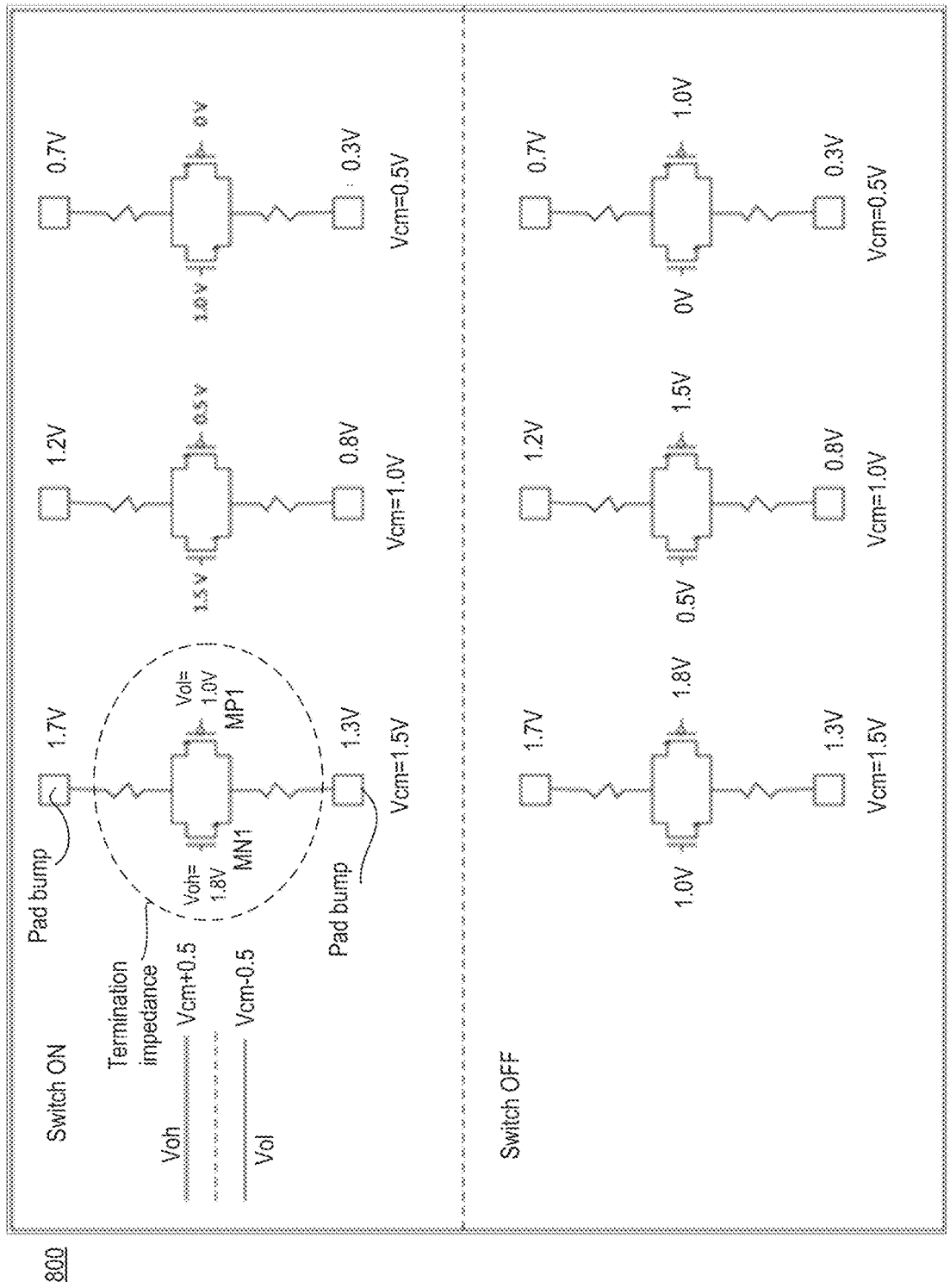
FIG. 8 illustrates termination switch with switch control voltages for three different common mode voltages for both an on and off state for the switches.

FIG. 8 illustrates termination switch 800 with control voltages for three different common mode voltages ($V_{cm}$) for both an on and off state for the switches. The single-ended voltage on a pad is determined by the common mode voltage and the differential signal between the pads ($V_{id}$). The low-voltage differential signaling (LVDS) receiver supports a wide range of input common voltages $V_{cm}$ from 0.5V–1.5V, for example, and a maximum $V_{id}$ of 560 mV, for example. This combination pushes the pad voltages well in excess of the 1V requirement for a thin oxide device.

$$V\text{pad\_max} = V\text{os\_max} + V\text{id\_max}/2$$

$$V\text{pad\_max} = 1.5 + 0.56/2 = 1.78 \text{ V}$$

Various embodiments describe the control mechanism that either enable or disable the termination devices MP1 and MN1. The signals that control the voltages to the gates of MN1 and MP1 are digital in nature whose maximum (Voh) and minimum (Vol) values are determined by the supply voltage used to generate them. These digital Voh and Vol levels must be constrained in order to be able to either enable or disable devices MN1 and MP1 without exceeding the maximum voltage rating on the devices gate oxide. Some embodiments provide a LVDS termination switch control voltage scheme that uses a feed forward approach resulting in a significant reduction in both area and power from the previous design. This architecture provides common mode, process and temperature tracking while keeping the voltage across a switch to less than the 1 V maximum. This architecture provides common mode, process and temperature tracking while keeping the voltage across a switch to less than the 1 V maximum.

Figure 9:
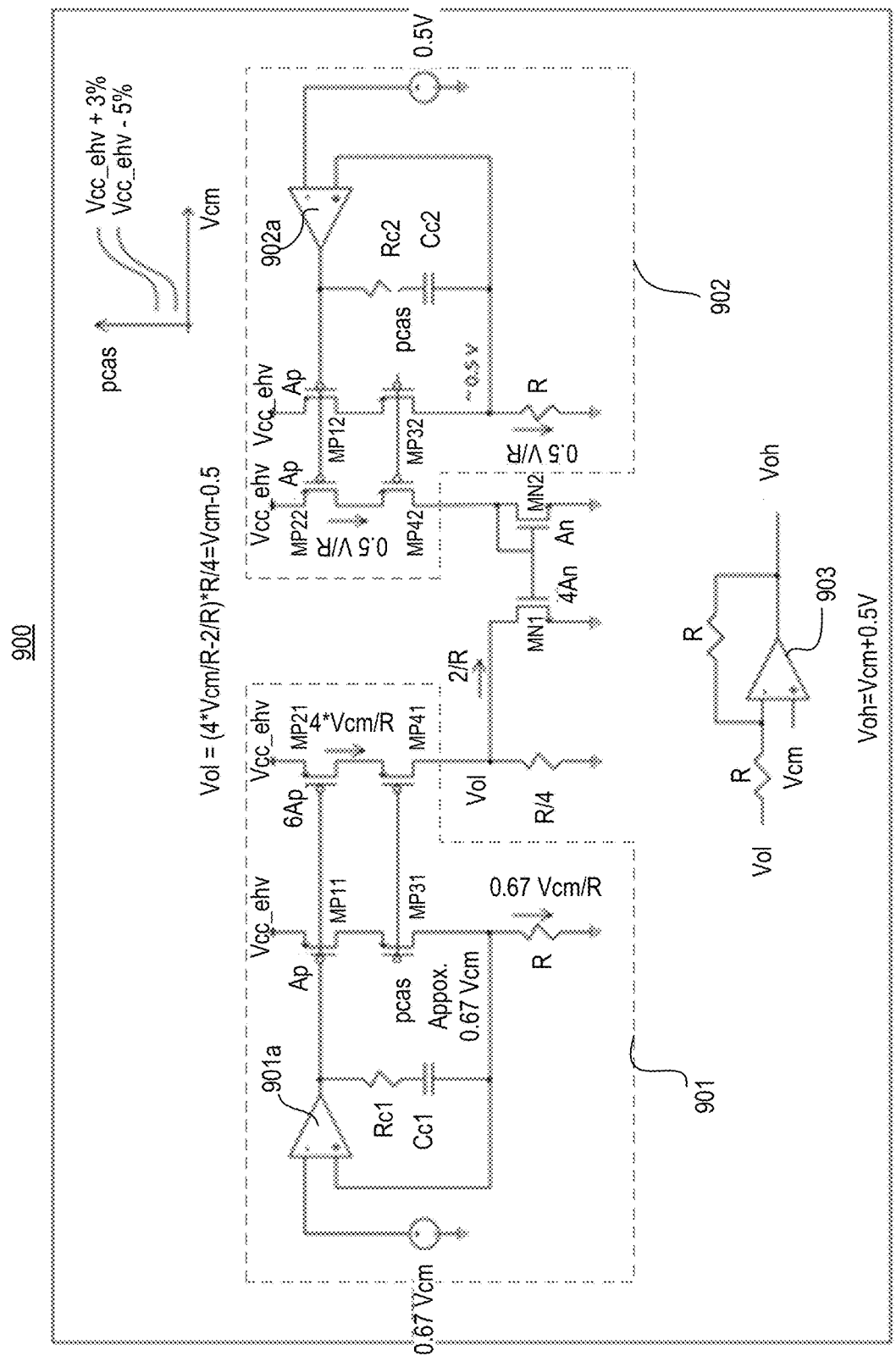
FIG. 9 illustrates an apparatus for creating a switch control voltage that tracks the input common mode, in accordance with some embodiments.

FIG. 9 illustrates apparatus 900 for creating switch control voltages (Vol and Voh) that tracks the input common mode Vcm, in accordance with some embodiments. With reference to the example of FIG. 8, for the termination impedance, Voh is 1.8 V and Vol is 1.0 V. Here, the gate of transistor MN1 is biased by Voh while the gate of transistor MP1 is biased by Vol.

Apparatus 900 includes voltage-to-current (V2I) circuit topologies 901 and 902 to create a switch control voltage that tracks the common mode voltage. V21 circuitry 901 includes amplifier or comparator 901a, p-type transistors MP11, MP21, MP31, MP41, resistor Rc1, resistor R, and capacitor Cc1 coupled as shown. In some embodiments, MN21 is larger than MP11 (e.g., by six times). V21 circuitry 902 includes amplifier or comparator 902a, p-type transistors MP12, MP22, MP32, MP42, resistor Rc2, resistor R, and capacitor Cc2 coupled as shown. In some embodiments, MP22 is larger than MP12 (e.g., by six times). As such, current through MP22 is 6 times the current through MP12. Transistors MP41 and MP42 are coupled to a current mirror comprising transistors MN1 and MN2, where MN1 is larger (e.g., 4 times) than MN2. As such, current through MN1 is 4 times (current multiplying factor) larger than current through MN1. In various embodiments, the current multiplying factor can be other than 6 or 4 shown in FIG. 9. V21 circuitry 901 and V21 circuitry 902 generate Vol. In this example, Vol=4*Vcm/R−2/R)*R/4=Vcm−0.5. Here, "pcas" is a cascode bias voltage which is used to bias the cascode devices MP31, MP41, MP42, and MP32. "pcas" voltage scales with common mode voltage Vcm and power supply Vcc_ehv as shown in FIG. 9. In this example, the reference voltages 0.67 Vcm and 0.5 Vcm are generated by a resistor divider (not shown) from the common mode voltage Vcm. The maximum voltage difference across the gate oxide of the switches of FIG. 8 can be 1 V which satisfies the thin oxide requirement. This 1V is determined by Vol and Voh generated by FIG. 9. Apparatus 900 uses two amplifiers (one in each of 901 and 902) and compensation networks. Vol is then used to generate Voh as shown, by an additional amplifier 903.

Figure 10:
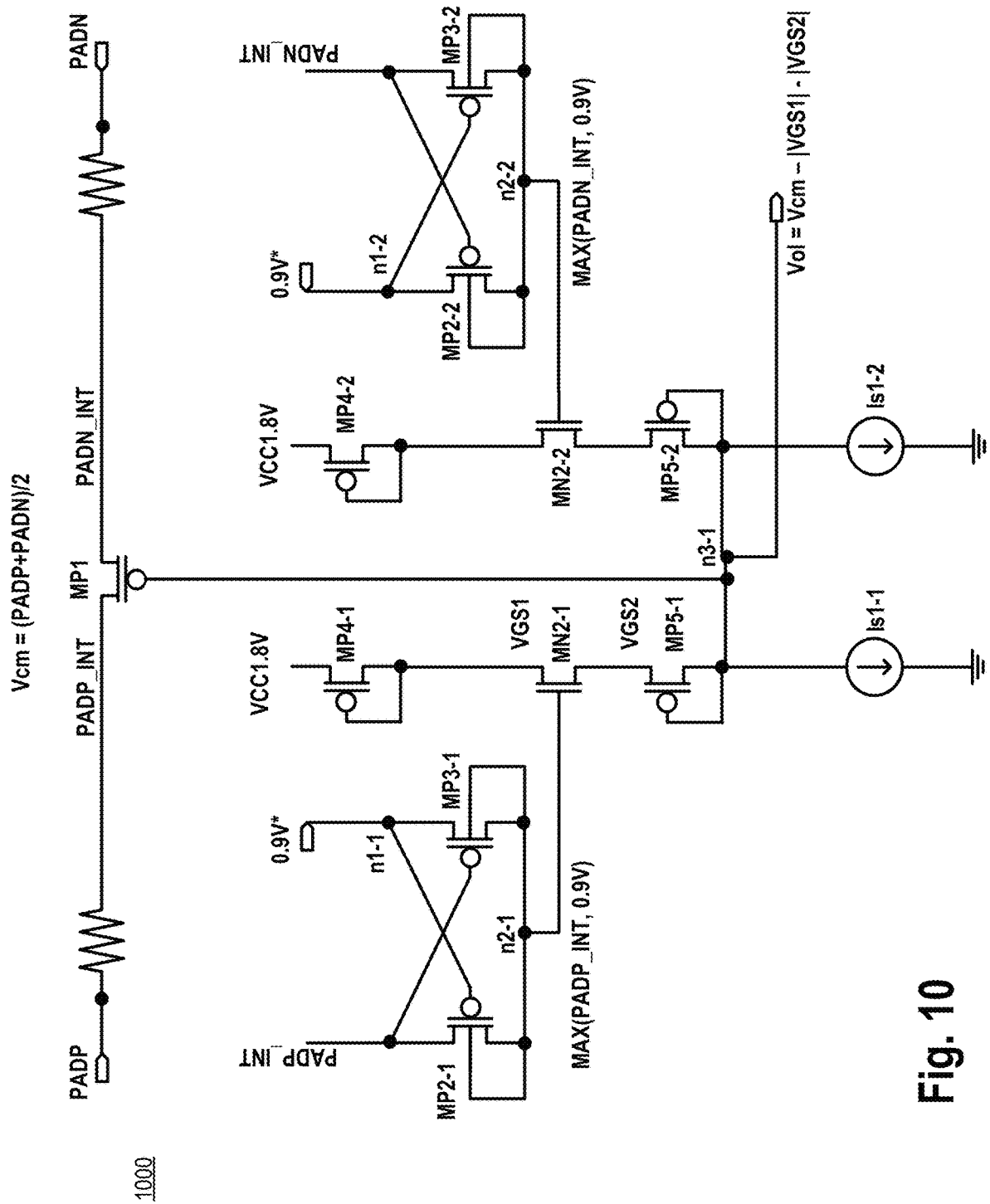
FIG. 10 illustrates a feedforward voltage control scheme providing common mode voltage tracking, in accordance with some embodiments.

FIG. 10 illustrates feedforward voltage control scheme 1000 providing common mode voltage tracking, in accordance with some embodiments. Scheme 1000 includes circuitry to control termination impedance device MP1 which is coupled to pad bumps (nodes PADP_INT and PADN_INT). A similar circuitry is used to control termination impedance device MN1. The scheme comprises cross-coupled p-type devices MP2-1 and MP3-1. The gate of MP3-1 is coupled to node PADP_INT node, which is coupled to termination impedance device MP1. The gate of MP2-1 is coupled to node n1-1, which is provided a predetermined voltage (e.g., 0.9 V). The drains of both MP2-1 and MP3-1 are coupled to node n2-1 which is coupled to n-type transistor MN2-1. Transistor MN2-1 is coupled in series with diode-connected MP4-1 and MP5-1. MP5-1 is coupled to current source Is1-1. The source of MP4-1 is coupled to the power supply (e.g., Vcc of 1.8 V). The drain of MP5-1 is n3-1 which controls MP1.

The scheme comprises cross-coupled p-type devices MP2-2 and MP3-2. The gate of MP3-2 is coupled to node PADN_INT node, which is coupled to termination impedance device MP1. The gate of MP2-2 is coupled to node n2-2, which is provided a predetermined voltage (e.g., 0.9 V). The drains of both MP2-2 and MP3-2 are coupled to node n2-1 which is coupled to n-type transistor MN2-2. Transistor MN2-2 is coupled in series with diode-connected MP4-2 and MP5-2. MP5-2 is coupled to current source Is1-2. The source of MP4-2 is coupled to the power supply (e.g., Vcc of 1.8 V). The drain of MP5-2 is n3-1 which controls MP1. Here, MP1 of FIG. 10 refers to termination impedance MP1 of FIG. 8. The circuitry of FIG. 10 generates Vol for the gate of transistor MP1, in accordance with some embodiments. This Vol generation scheme is different or alternate to the scheme of FIG. 9.

Figure 11:
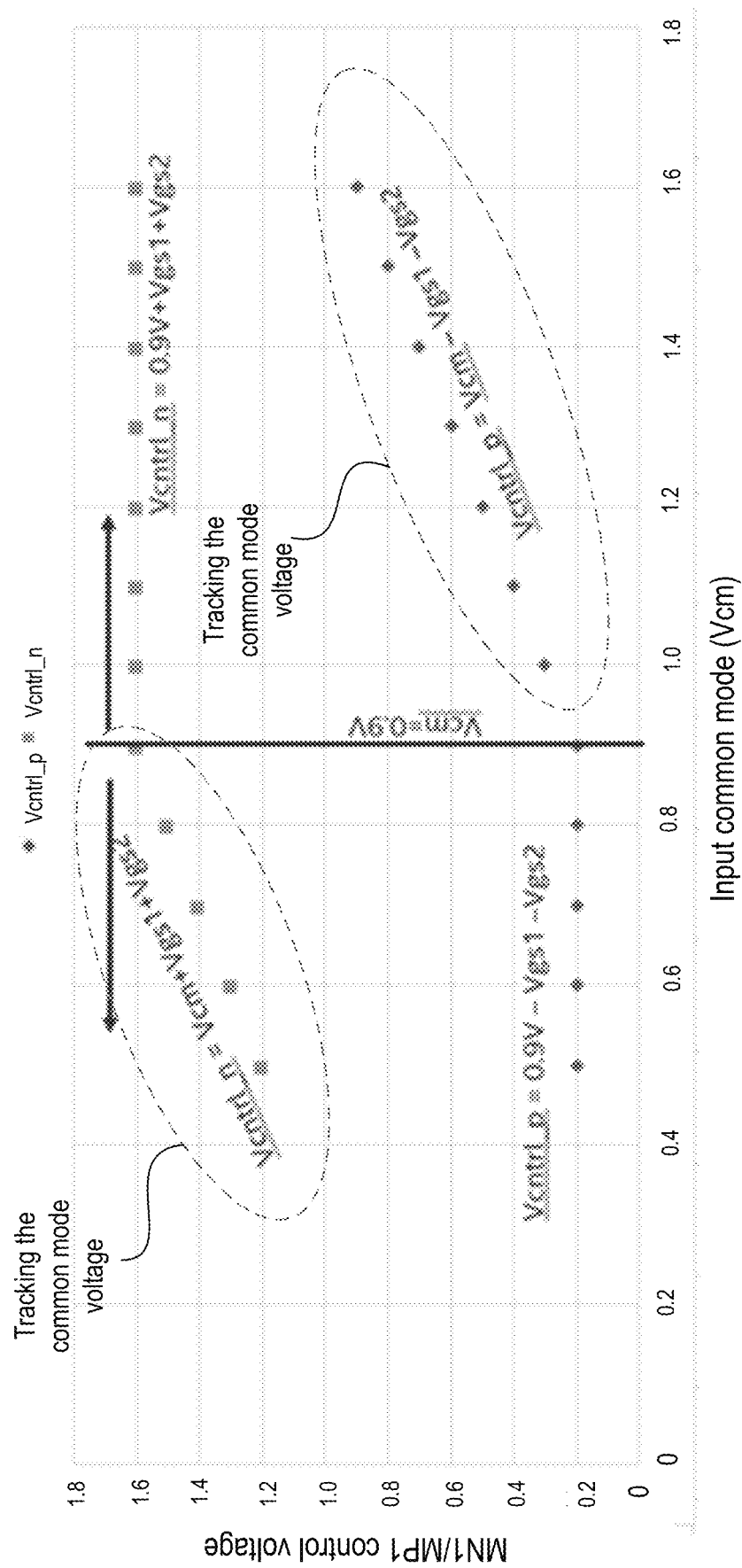
FIG. 11 illustrates a plot showing n-switch and p-switch control voltage vs. common mode, in accordance with some embodiments.

FIG. 11 illustrates plot 1100 showing n-switch and p-switch control voltage vs. common mode, in accordance with some embodiments. Plot 1100 shows the p-switch MP1 and n-switch MN1 controls with respect to the input common mode voltage. Note, MP1 and MN1 are the impedance switches of FIG. 8. In some embodiments, N-switch control voltage is level shifted up version of input common mode voltage for input common mode less than 1V and saturates for input common voltage greater than 1V. In some embodiments, P-switch control is level shifted down from input common voltage for input common mode greater than 1V and saturates for input common voltage less than 1V.

Figure 12:
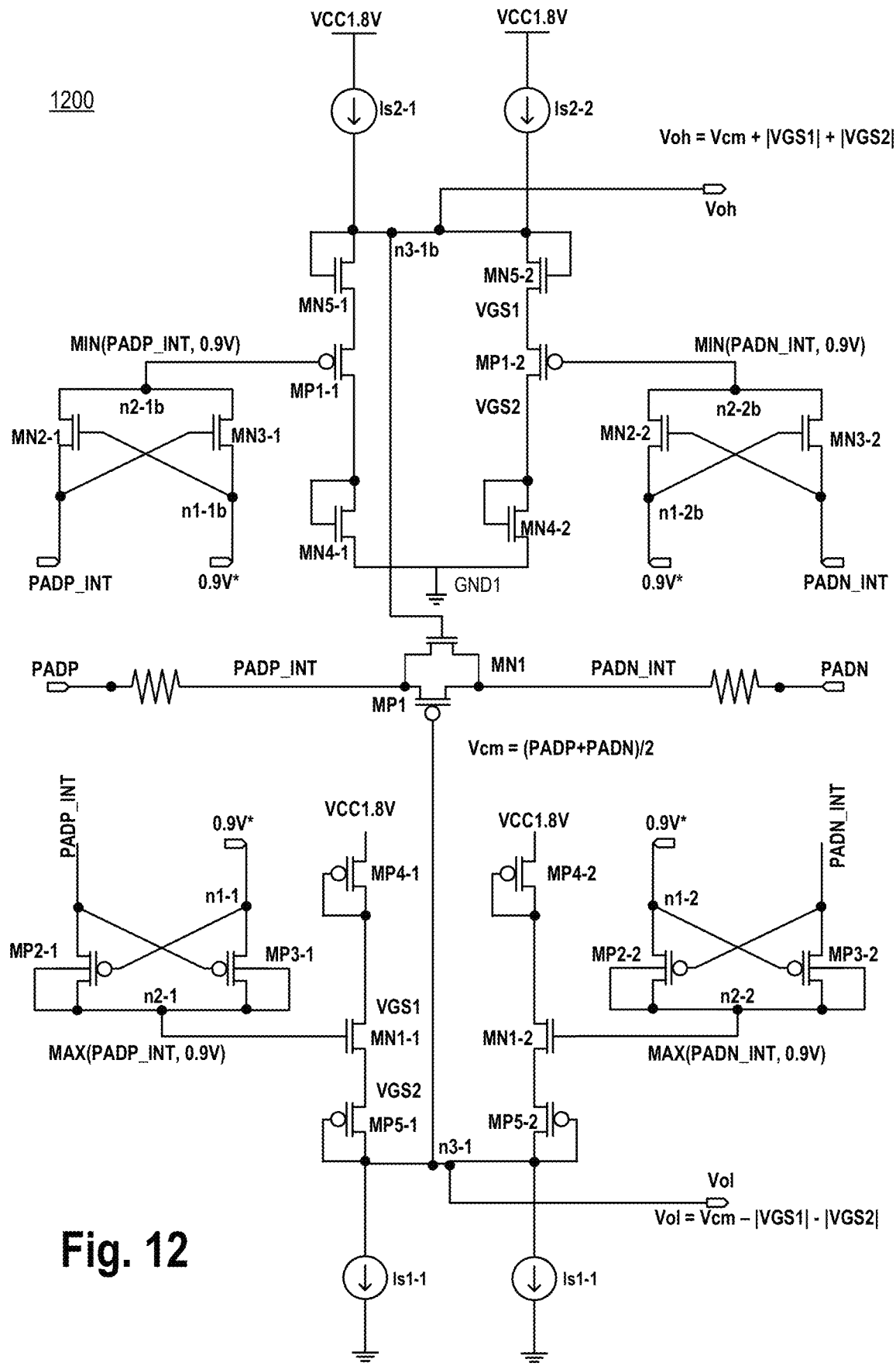
FIG. 12 illustrates an apparatus to generate n-switch and p-switch control voltages, in accordance with some embodiments.

FIG. 12 illustrates apparatus 1200 to generate n-switch and p-switch control voltages, in accordance with some embodiments. FIG. 12 shows the n-switch MN1 and p-switch MP1 control voltage generation scheme. Nodes PADP and PADN are LVDS differential input pins. Apparatus 1200 includes the control apparatus discussed with reference to FIG. 10 to control the p-switch MP1 and flipped version of the control apparatus to control the n-switch MN1. Here, MP1 and MN1 are same as the termination switches MP1 and MN1 of FIG. 8. The circuitry of FIG. 12 generates Vol for the gate of transistor MP1 and Voh for the gate of transistor MN1, in accordance with some embodiments. This Vol and Voh generation scheme is different or alternate to the scheme of FIG. 9.

The scheme to control MN1 comprises cross-coupled n-type devices MN2-1 and MN3-1. The gate of MN3-1 is coupled to node PADP_INT node, which is coupled to termination impedance device MN1. The gate of MN2-1 is coupled to node n1-1b, which is provided a predetermined voltage (e.g., 0.9 V). The drains of both MN2-1 and MN3-1 are coupled to node n2-1b which is coupled to p-type transistor MP1-1. Transistor MP1-1 is coupled in series with diode-connected MN4-1 and MN5-1. MN5-1 is coupled to current source Is2-1. The source of MN4-1 is coupled to the power supply (e.g., Vcc of 1.8 V). The drain of MN5-1 is n3-1b which controls MN1.

The scheme comprises cross-coupled p-type devices MN2-2 and MN3-2. The gate of MN3-2 is coupled to node PADN_INT node, which is coupled to termination impedance device MN1. The gate of MN2-2 is coupled to node n2-2b, which is provided a predetermined voltage (e.g., 0.9 V). The drains of both MN2-2 and MN3-2 are coupled to node n2-2b which is coupled to n-type transistor MN1-2. Transistor MN1-2 is coupled in series with diode-connected MN4-2 and MN5-2. MN5-2 is coupled to current source Is2-2. The source of MN4-2 is coupled to the power supply (e.g., Vcc of 1.8 V). The drain of MN5-2 is n3-1b which controls MN1.

For p-switch control, the scheme compares the PADP_INT and PADM_INT voltages (close to common mode). (PADP_INT, 0.9 V) and (PADM_INT, 0.9 V), respectively, that go to the maximum (max) circuit. The output of the max circuit is Max(0.9V, Input common mode voltage). For example, if common mode voltage 1.1 V, output of max circuit=Max(0.9, 1.1)=1.1 V and pswitch control=1.1 V−Vgsp−Vgsn. Vgsp is dominant here as nmos is strong but pmos is weak. If Vgsp=0.5V, Vgsn=0.3 V, for Input common mode voltage of 1.1V, p-switch MP1 gate control will be=1.1−(0.5+0.3)=0.3 V. For input common mode voltage=0.5V, Max (0.5, 0.9)=0.9V, p-switch MP1 control=0.9−(0.5+0.3)=0.1V.

For n-switch MN1 control, PADP_INT & PADM_INT voltage (close to common mode). Pad voltages, (PADP_INT, 0.9V) and (PADM_INT, 0.9V), goes to the minimum (min) circuit. Min Circuit output=Min(Input common mode, 0.9V), for input common mode=1.1V, Min circuit output=Min(1.1, 0.9)=0.9 V. Min Circuit voltage I level shifted up by Vgsp+Vgsn. If Vgsp=0.3V, Vgsn=0.5V. n-switch MN1 control will be 0.9+(0.5+0.3)=1.7V.

Figure 13:
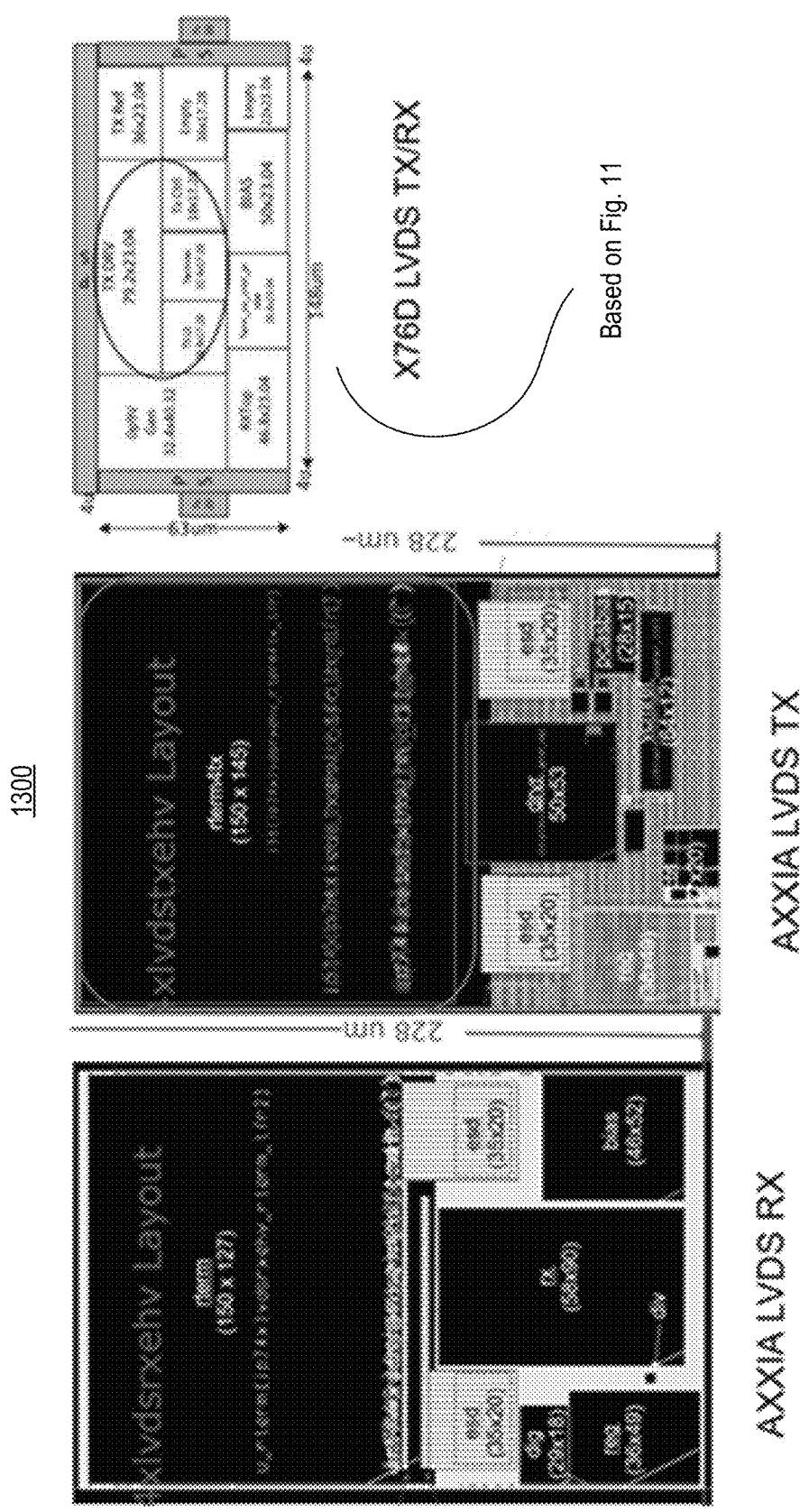
FIG. 13 illustrates layouts of LVDS transmitter using apparatus FIG. 9 and apparatus of FIG. 11, in accordance with some embodiments.

FIG. 13 illustrates layouts 1300 of LVDS transmitter using apparatus FIG. 9 and apparatus of FIG. 11, in accordance with some embodiments. Layout using scheme of FIG. 11 results in smaller area than layout of control scheme based on FIG. 9.

Figure 14:
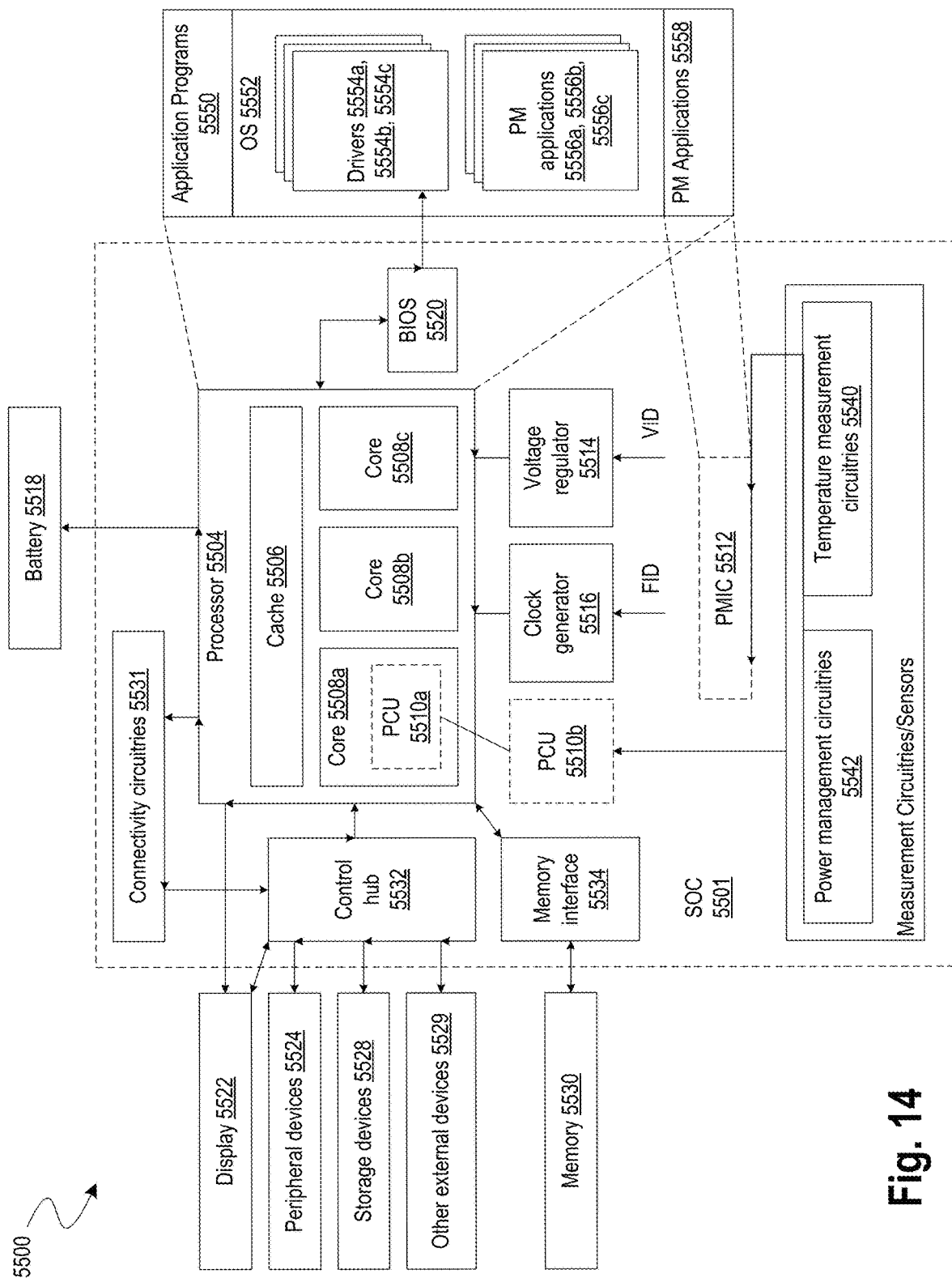
FIG. 14 illustrates a smart device or a computer system or a SoC (System-on-Chip) having a quadrature clock generator comprising shunt-series peaked inductive clock buffer and/or an impedance control scheme, in accordance with some embodiments.

FIG. 14 illustrates a smart device or a computer system or a SoC (System-on-Chip) having a quadrature clock generator comprising shunt-series peaked inductive clock buffer and/or an impedance control scheme, in accordance with some embodiments. It is pointed out that those elements of FIG. 14 having the same reference numbers (or names) as the elements of any other figure may operate or function in any manner similar to that described, but are not limited to such.

In some embodiments, device 5500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 5500.

In an example, the device 5500 comprises an SoC (System-on-Chip) 5501. An example boundary of the SoC 5501 is illustrated using dotted lines in FIG. 14, with some example components being illustrated to be included within SoC 5501—however, SoC 5501 may include any appropriate components of device 5500.

In some embodiments, device 5500 includes processor 5504. Processor 5504 can include one or more physical devices, such as microprocessors, application processors, microcontrollers, programmable logic devices, processing cores, or other processing means. The processing operations performed by processor 5504 include the execution of an operating platform or operating system on which applications and/or device functions are executed. The processing operations include operations related to I/O (input/output) with a human user or with other devices, operations related to power management, operations related to connecting computing device 5500 to another device, and/or the like. The processing operations may also include operations related to audio I/O and/or display I/O.

In some embodiments, processor 5504 includes multiple processing cores (also referred to as cores) 5508a, 5508b, 5508c. Although merely three cores 5508a, 5508b, 5508c are illustrated in FIG. 14, processor 5504 may include any other appropriate number of processing cores, e.g., tens, or even hundreds of processing cores. Processor cores 5508a, 5508b, 5508c may be implemented on a single integrated circuit (IC) chip. Moreover, the chip may include one or more shared and/or private caches, buses or interconnections, graphics and/or memory controllers, or other components.

In some embodiments, processor 5504 includes cache 5506. In an example, sections of cache 5506 may be dedicated to individual cores 5508 (e.g., a first section of cache 5506 dedicated to core 5508a, a second section of cache 5506 dedicated to core 5508b, and so on). In an example, one or more sections of cache 5506 may be shared among two or more of cores 5508. Cache 5506 may be split in different levels, e.g., level 1 (L1) cache, level 2 (L2) cache, level 3 (L3) cache, etc.

In some embodiments, processor core 5504 may include a fetch unit to fetch instructions (including instructions with conditional branches) for execution by the core 5504. The instructions may be fetched from any storage devices such as the memory 5530. Processor core 5504 may also include a decode unit to decode the fetched instruction. For example, the decode unit may decode the fetched instruction into a plurality of micro-operations. Processor core 5504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 5504 may be an out-of-order processor core in one embodiment. Processor core 5504 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 5504 may also include a bus unit to enable communication between components of processor core 5504 and other components via one or more buses. Processor core 5504 may also include one or more registers to store data accessed by various components of the core 5504 (such as values related to assigned app priorities and/or sub-system states (modes) association.

In some embodiments, device 5500 comprises connectivity circuitries 5531. For example, connectivity circuitries 5531 includes hardware devices (e.g., wireless and/or wired connectors and communication hardware) and/or software components (e.g., drivers, protocol stacks), e.g., to enable device 5500 to communicate with external devices. Device 5500 may be separate from the external devices, such as other computing devices, wireless access points or base stations, etc.

In an example, connectivity circuitries 5531 may include multiple different types of connectivity. To generalize, the connectivity circuitries 5531 may include cellular connectivity circuitries, wireless connectivity circuitries, etc. Cellular connectivity circuitries of connectivity circuitries 5531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 5531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 5531 may include a network interface, such as a wired or wireless interface, e.g., so that a system embodiment may be incorporated into a wireless device, for example, a cell phone or personal digital assistant.

In some embodiments, device 5500 comprises control hub 5532, which represents hardware devices and/or software components related to interaction with one or more I/O devices. For example, processor 5504 may communicate with one or more of display 5522, one or more peripheral devices 5524, storage devices 5528, one or more other external devices 5529, etc., via control hub 5532. Control hub 5532 may be a chipset, a Platform Control Hub (PCH), and/or the like.

For example, control hub 5532 illustrates one or more connection points for additional devices that connect to device 5500, e.g., through which a user might interact with the system. For example, devices (e.g., devices 5529) that can be attached to device 5500 include microphone devices, speaker or stereo systems, audio devices, video systems or other display devices, keyboard or keypad devices, or other I/O devices for use with specific applications such as card readers or other devices.

As mentioned above, control hub 5532 can interact with audio devices, display 5522, etc. For example, input through a microphone or other audio device can provide input or commands for one or more applications or functions of device 5500. Additionally, audio output can be provided instead of, or in addition to display output. In another example, if display 5522 includes a touch screen, display 5522 also acts as an input device, which can be at least partially managed by control hub 5532. There can also be additional buttons or switches on computing device 5500 to provide I/O functions managed by control hub 5532. In one embodiment, control hub 5532 manages devices such as accelerometers, cameras, light sensors or other environmental sensors, or other hardware that can be included in device 5500. The input can be part of direct user interaction, as well as providing environmental input to the system to influence its operations (such as filtering for noise, adjusting displays for brightness detection, applying a flash for a camera, or other features).

In some embodiments, control hub 5532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 5522 represents hardware (e.g., display devices) and software (e.g., drivers) components that provide a visual and/or tactile display for a user to interact with device 5500. Display 5522 may include a display interface, a display screen, and/or hardware device used to provide a display to a user. In some embodiments, display 5522 includes a touch screen (or touch pad) device that provides both output and input to a user. In an example, display 5522 may communicate directly with the processor 5504. Display 5522 can be one or more of an internal display device, as in a mobile electronic device or a laptop device or an external display device attached via a display interface (e.g., DisplayPort, etc.). In one embodiment display 5522 can be a head mounted display (HMD) such as a stereoscopic display device for use in virtual reality (VR) applications or augmented reality (AR) applications.

In some embodiments, and although not illustrated in the figure, in addition to (or instead of) processor 5504, device 5500 may include Graphics Processing Unit (GPU) comprising one or more graphics processing cores, which may control one or more aspects of displaying contents on display 5522.

Control hub 5532 (or platform controller hub) may include hardware interfaces and connectors, as well as software components (e.g., drivers, protocol stacks) to make peripheral connections, e.g., to peripheral devices 5524.

It will be understood that device 5500 could both be a peripheral device to other computing devices, as well as have peripheral devices connected to it. Device 5500 may have a "docking" connector to connect to other computing devices for purposes such as managing (e.g., downloading and/or uploading, changing, synchronizing) content on device 5500. Additionally, a docking connector can allow device 5500 to connect to certain peripherals that allow computing device 5500 to control content output, for example, to audiovisual or other systems.

In addition to a proprietary docking connector or other proprietary connection hardware, device 5500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 5531 may be coupled to control hub 5532, e.g., in addition to, or instead of, being coupled directly to the processor 5504. In some embodiments, display 5522 may be coupled to control hub 5532, e.g., in addition to, or instead of, being coupled directly to processor 5504.

In some embodiments, device 5500 comprises memory 5530 coupled to processor 5504 via memory interface 5534. Memory 5530 includes memory devices for storing information in device 5500.

In some embodiments, memory 5530 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 5530 can be a dynamic random-access memory (DRAM) device, a static random-access memory (SRAM) device, flash memory device, phase-change memory device, or some other memory device having suitable performance to serve as process memory. In one embodiment, memory 5530 can operate as system memory for device 5500, to store data and instructions for use when the one or more processors 5504 executes an application or process. Memory 5530 can store application data, user data, music, photos, documents, or other data, as well as system data (whether long-term or temporary) related to the execution of the applications and functions of device 5500.

Elements of various embodiments and examples are also provided as a machine-readable medium (e.g., memory 5530) for storing the computer-executable instructions (e.g., instructions to implement any other processes discussed herein). The machine-readable medium (e.g., memory 5530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 5500 comprises temperature measurement circuitries 5540, e.g., for measuring temperature of various components of device 5500. In an example, temperature measurement circuitries 5540 may be embedded, or coupled or attached to various components, whose temperature are to be measured and monitored. For example, temperature measurement circuitries 5540 may measure temperature of (or within) one or more of cores 5508*a*, 5508*b*, 5508*c*, voltage regulator 5514, memory 5530, a mother-board of SoC 5501, and/or any appropriate component of device 5500. In some embodiments, temperature measurement circuitries 5540 include a low power hybrid reverse (LPHR) bandgap reference (BGR) and digital temperature sensor (DTS), which utilizes subthreshold metal oxide semiconductor (MOS) transistor and the PNP parasitic Bi-polar Junction Transistor (BJT) device to form a reverse BGR that serves as the base for configurable BGR or DTS operating modes. The LPHR architecture uses low-cost MOS transistors and the standard parasitic PNP device. Based on a reverse bandgap voltage, the LPHR can work as a configurable BGR. By comparing the configurable BGR with the scaled base-emitter voltage, the circuit can also perform as a DTS with a linear transfer function with single-temperature trim for high accuracy.

In some embodiments, device 5500 comprises power measurement circuitries 5542, e.g., for measuring power consumed by one or more components of the device 5500. In an example, in addition to, or instead of, measuring power, the power measurement circuitries 5542 may measure voltage and/or current. In an example, the power measurement circuitries 5542 may be embedded, or coupled or attached to various components, whose power, voltage, and/or current consumption are to be measured and monitored. For example, power measurement circuitries 5542 may measure power, current and/or voltage supplied by one or more voltage regulators 5514, power supplied to SoC 5501, power supplied to device 5500, power consumed by processor 5504 (or any other component) of device 5500, etc.

In some embodiments, device 5500 comprises one or more voltage regulator circuitries, generally referred to as voltage regulator (VR) 5514. VR 5514 generates signals at appropriate voltage levels, which may be supplied to operate any appropriate components of the device 5500. Merely as an example, VR 5514 is illustrated to be supplying signals to processor 5504 of device 5500. In some embodiments, VR 5514 receives one or more Voltage Identification (VID) signals, and generates the voltage signal at an appropriate level, based on the VID signals. Various type of VRs may be utilized for the VR 5514. For example, VR 5514 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 5510*a/b* and/or PMIC 5512. In some embodiments, each core has a network of distributed LDOs to provide efficient control for power management. The LDOs can be digital, analog, or a combination of digital or analog LDOs. In some embodiments, VR 5514 includes current tracking apparatus to measure current through power supply rail(s).

In some embodiments, VR 5514 includes a digital control scheme to manage states of a proportional-integral-derivative (PID) filter (also known as a digital Type-III compensator). The digital control scheme controls the integrator of the PID filter to implement non-linear control of saturating the duty cycle during which the proportional and derivative terms of the PID are set to 0 while the integrator and its internal states (previous values or memory) is set to a duty cycle that is the sum of the current nominal duty cycle plus a deltaD. The deltaD is the maximum duty cycle increment that is used to regulate a voltage regulator from ICCmin to ICCmax and is a configuration register that can be set post silicon. A state machine moves from a non-linear all ON state (which brings the output voltage Vout back to a regulation window) to an open loop duty cycle which maintains the output voltage slightly higher than the required reference voltage Vref. After a certain period in this state of open loop at the commanded duty cycle, the state machine then ramps down the open loop duty cycle value until the output voltage is close to the Vref commanded. As such, output chatter on the output supply from VR 5514 is completely eliminated (or substantially eliminated) and there is merely a single undershoot transition which could lead to a guaranteed Vmin based on a comparator delay and the di/dt of the load with the available output decoupling capacitance.

In some embodiments, VR 5514 includes a separate self-start controller, which is functional without fuse and/or trim information. The self-start controller protects VR 5514 against large inrush currents and voltage overshoots, while being capable of following a variable VID (voltage identification) reference ramp imposed by the system. In some embodiments, the self-start controller uses a relaxation oscillator built into the controller to set the switching frequency of the buck converter. The oscillator can be initialized using either a clock or current reference to be close to a desired operating frequency. The output of VR 5514 is coupled weakly to the oscillator to set the duty cycle for closed loop operation. The controller is naturally biased such that the output voltage is always slightly higher than the set point, eliminating the need for any process, voltage, and/or temperature (PVT) imposed trims.

In some embodiments, VR 5514 includes a controlled current source or a parallel current source (PCS) to assist a DC-DC buck converter and to alleviate the stress on the C4 bumps while boosting the efficiency of the DC-DC converter at the high-load current scenarios. The PSC adds current to the output power supply rail, which is coupled to a load. In some embodiments, the PCS is activated to mitigate droop events due to high di/dt events on the output power supply rail. The PCS provides charge directly to the load (driving in parallel to the DC-DC converter) whenever the current supplied by the DC-DC converter is above a certain threshold level.

In some embodiments, device 5500 comprises one or more clock generator circuitries, generally referred to as clock generator 5516. Clock generator 5516 generates clock signals at appropriate frequency levels, which may be supplied to any appropriate components of device 5500. Merely as an example, clock generator 5516 is illustrated to be supplying clock signals to processor 5504 of device 5500. In some embodiments, clock generator 5516 receives one or more Frequency Identification (FID) signals, and generates the clock signals at an appropriate frequency, based on the FID signals.

In some embodiments, device 5500 comprises battery 5518 supplying power to various components of device 5500. Merely as an example, battery 5518 is illustrated to be supplying power to processor 5504. Although not illustrated in the figures, device 5500 may comprise a charging circuitry, e.g., to recharge the battery, based on Alternating Current (AC) power supply received from an AC adapter.

In some embodiments, the charging circuitry (e.g., 5518) comprises a buck-boost converter. This buck-boost converter comprises DrMOS or DrGaN devices used in place of half-bridges for traditional buck-boost converters. Various embodiments here are described with reference to DrMOS. However, the embodiments are applicable to DrGaN. The DrMOS devices allow for better efficiency in power conversion due to reduced parasitic and optimized MOSFET packaging. Since the dead-time management is internal to the DrMOS, the dead-time management is more accurate than for traditional buck-boost converters leading to higher efficiency in conversion. Higher frequency of operation allows for smaller inductor size, which in turn reduces the z-height of the charger comprising the DrMOS based buck-boost converter. The buck-boost converter of various embodiments comprises dual-folded bootstrap for DrMOS devices. In some embodiments, in addition to the traditional bootstrap capacitors, folded bootstrap capacitors are added that cross-couple inductor nodes to the two sets of DrMOS switches.

In some embodiments, device 5500 comprises Power Control Unit (PCU) 5510 (also referred to as Power Management Unit (PMU), Power Management Controller (PMC), Power Unit (p-unit), etc.). In an example, some sections of PCU 5510 may be implemented by one or more processing cores 5508, and these sections of PCU 5510 are symbolically illustrated using a dotted box and labeled PCU 5510*a*. In an example, some other sections of PCU 5510 may be implemented outside the processing cores 5508, and these sections of PCU 5510 are symbolically illustrated using a dotted box and labeled as PCU 5510*b*. PCU 5510 may implement various power management operations for device 5500. PCU 5510 may include hardware interfaces, hardware circuitries, connectors, registers, etc., as well as software components (e.g., drivers, protocol stacks), to implement various power management operations for device 5500.

In various embodiments, PCU or PMU 5510 is organized in a hierarchical manner forming a hierarchical power management (HPM). HPM of various embodiments builds a capability and infrastructure that allows for package level management for the platform, while still catering to islands of autonomy that might exist across the constituent die in the package. HPM does not assume a pre-determined mapping of physical partitions to domains. An HPM domain can be aligned with a function integrated inside a dielet, to a dielet boundary, to one or more dielets, to a companion die, or even a discrete CXL device. HPM addresses integration of multiple instances of the same die, mixed with proprietary functions or 3rd party functions integrated on the same die or separate die, and even accelerators connected via CXL (e.g., Flexbus) that may be inside the package, or in a discrete form factor.

HPM enables designers to meet the goals of scalability, modularity, and late binding. HPM also allows PMU functions that may already exist on other dice to be leveraged, instead of being disabled in the flat scheme. HPM enables management of any arbitrary collection of functions independent of their level of integration. HPM of various embodiments is scalable, modular, works with symmetric multi-chip processors (MCPs), and works with asymmetric MCPs. For example, HPM does not need a signal PM controller and package infrastructure to grow beyond reasonable scaling limits. HPM enables late addition of a die in a package without the need for change in the base die infrastructure. HPM addresses the need of disaggregated solutions having dies of different process technology nodes coupled in a single package. HPM also addresses the needs of companion die integration solutions—on and off package. Other technical effects will be evident from the various figures and embodiments.

In some embodiments, device 5500 comprises Power Management Integrated Circuit (PMIC) 5512, e.g., to implement various power management operations for device 5500. In some embodiments, PMIC 5512 is a Reconfigurable Power Management ICs (RPMICs) and/or an IMVP (Intel® Mobile Voltage Positioning). In an example, the PMIC is within an IC die separate from processor 5504. The may implement various power management operations for device 5500. PMIC 5512 may include hardware interfaces, hardware circuitries, connectors, registers, etc., as well as software components (e.g., drivers, protocol stacks), to implement various power management operations for device 5500.

In an example, device 5500 comprises one or both PCU 5510 or PMIC 5512. In an example, any one of PCU 5510 or PMIC 5512 may be absent in device 5500, and hence, these components are illustrated using dotted lines.

Various power management operations of device 5500 may be performed by PCU 5510, by PMIC 5512, or by a combination of PCU 5510 and PMIC 5512. For example, PCU 5510 and/or PMIC 5512 may select a power state (e.g., P-state) for various components of device 5500. For example, PCU 5510 and/or PMIC 5512 may select a power state (e.g., in accordance with the ACPI (Advanced Configuration and Power Interface) specification) for various components of device 5500. Merely as an example, PCU 5510 and/or PMIC 5512 may cause various components of the device 5500 to transition to a sleep state, to an active state, to an appropriate C state (e.g., C0 state, or another appropriate C state, in accordance with the ACPI specification), etc. In an example, PCU 5510 and/or PMIC 5512 may control a voltage output by VR 5514 and/or a frequency of a clock signal output by the clock generator, e.g., by outputting the VID signal and/or the FID signal, respectively. In an example, PCU 5510 and/or PMIC 5512 may control battery power usage, charging of battery 5518, and features related to power saving operation.

The clock generator 5516 can comprise a phase locked loop (PLL), frequency locked loop (FLL), or any suitable clock source. In some embodiments, each core of processor 5504 has its own clock source. As such, each core can operate at a frequency independent of the frequency of operation of the other core. In some embodiments, PCU 5510 and/or PMIC 5512 performs adaptive or dynamic frequency scaling or adjustment. For example, clock frequency of a processor core can be increased if the core is not operating at its maximum power consumption threshold or limit. In some embodiments, PCU 5510 and/or PMIC 5512 determines the operating condition of each core of a processor, and opportunistically adjusts frequency and/or power supply voltage of that core without the core clocking source (e.g., PLL of that core) losing lock when the PCU 5510 and/or PMIC 5512 determines that the core is operating below a target performance level. For example, if a core is drawing current from a power supply rail less than a total current allocated for that core or processor 5504, then PCU 5510 and/or PMIC 5512 can temporarily increase the power draw for that core or processor 5504 (e.g., by increasing clock frequency and/or power supply voltage level) so that the core or processor 5504 can perform at higher performance level. As such, voltage and/or frequency can be increased temporarily for processor 5504 without violating product reliability.

In an example, PCU 5510 and/or PMIC 5512 may perform power management operations, e.g., based at least in part on receiving measurements from power measurement circuitries 5542, temperature measurement circuitries 5540, charge level of battery 5518, and/or any other appropriate information that may be used for power management. To that end, PMIC 5512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 5510 and/or PMIC 5512 in at least one embodiment to allow PCU 5510 and/or PMIC 5512 to manage processor core energy at least in part based on value(s) detected by one or more of the sensors.

Also illustrated is an example software stack of device 5500 (although not all elements of the software stack are illustrated). Merely as an example, processors 5504 may execute application programs 5550, Operating System 5552, one or more Power Management (PM) specific application programs (e.g., generically referred to as PM applications 5558), and/or the like. PM applications 5558 may also be executed by the PCU 5510 and/or PMIC 5512. OS 5552 may also include one or more PM applications 5556*a*, 5556*b*, 5556*c*. The OS 5552 may also include various drivers 5554*a*, 5554*b*, 5554*c*, etc., some of which may be specific for power management purposes. In some embodiments, device 5500 may further comprise a Basic Input/output System (BIOS) 5520. BIOS 5520 may communicate with OS 5552 (e.g., via one or more drivers 5554), communicate with processors 5504, etc.

For example, one or more of PM applications 5558, 5556, drivers 5554, BIOS 5520, etc. may be used to implement power management specific tasks, e.g., to control voltage and/or frequency of various components of device 5500, to control wake-up state, sleep state, and/or any other appropriate power state of various components of device 5500, control battery power usage, charging of the battery 5518, features related to power saving operation, etc.

In some embodiments, battery 5518 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, pCode executing on PCU 5510*a/b* has a capability to enable extra compute and telemetries resources for the runtime support of the pCode. Here pCode refers to a firmware executed by PCU 5510*a/b* to manage performance of the SoC 5501. For example, pCode may set frequencies and appropriate voltages for the processor. Part of the pCode are accessible via OS 5552. In various embodiments, mechanisms and methods are provided that dynamically change an Energy Performance Preference (EPP) value based on workloads, user behavior, and/or system conditions. There may be a well-defined interface between OS 5552 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 5552 by including machine-learning support as part of OS 5552 and either tuning the EPP value that the OS hints to the hardware (e.g., various components of SoC 5501) by machine-learning prediction, or by delivering the machine-learning prediction to the pCode in a manner similar to that done by a Dynamic Tuning Technology (DTT) driver. In this model, OS 5552 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 5552 and the other from software such as DTT, and may selectively choose to provide higher performance and/or responsiveness. As part of this method, the pCode may enable in the DTT an option to tune its reaction for the DTT for different types of activity.

In some embodiments, pCode improves the performance of the SoC in battery mode. In some embodiments, pCode allows drastically higher SoC peak power limit levels (and thus higher Turbo performance) in battery mode. In some embodiments, pCode implements power throttling and is part of Intel's Dynamic Tuning Technology (DTT). In various embodiments, the peak power limit is referred to PL4. However, the embodiments are applicable to other peak power limits. In some embodiments, pCode sets the Vth threshold voltage (the voltage level at which the platform will throttle the SoC) in such a way as to prevent the system from unexpected shutdown (or black screening). In some embodiments, pCode calculates the Psoc,pk SoC Peak Power Limit (e.g., PL4), according to the threshold voltage (Vth). These are two dependent parameters, if one is set, the other can be calculated. pCode is used to optimally set one parameter (Vth) based on the system parameters, and the history of the operation. In some embodiments, pCode provides a scheme to dynamically calculate the throttling level (Psoc,th) based on the available battery power (which changes slowly) and set the SoC throttling peak power (Psoc,th). In some embodiments, pCode decides the frequencies and voltages based on Psoc,th. In this case, throttling events have less negative effect on the SoC performance Various embodiments provide a scheme which allows maximum performance (Pmax) framework to operate.

In some embodiments, VR 5514 includes a current sensor to sense and/or measure current through a high-side switch of VR 5514. In some embodiments the current sensor uses an amplifier with capacitively coupled inputs in feedback to sense the input offset of the amplifier, which can be compensated for during measurement. In some embodiments, the amplifier with capacitively coupled inputs in feedback is used to operate the amplifier in a region where the input common-mode specifications are relaxed, so that the feedback loop gain and/or bandwidth is higher. In some embodiments, the amplifier with capacitively coupled inputs in feedback is used to operate the sensor from the converter input voltage by employing high-PSRR (power supply rejection ratio) regulators to create a local, clean supply voltage, causing less disruption to the power grid in the switch area. In some embodiments, a variant of the design can be used to sample the difference between the input voltage and the controller supply, and recreate that between the drain voltages of the power and replica switches. This allows the sensor to not be exposed to the power supply voltage. In some embodiments, the amplifier with capacitively coupled inputs in feedback is used to compensate for power delivery network related (PDN-related) changes in the input voltage during current sensing.

In some embodiments, the processor includes a fully-unrolled SHA256 datapath featuring a latch-based pipeline design clocked by 3-phase non-overlapping clocks. A scheme to improve throughput (performance) by modulating the clock duty cycle in a deterministic way to reduce the dead time in the latch-based pipeline design to a minimum that is needed in silicon. This DLL in a clock path is used to generate a non-50% duty cycle clock. The extra high phase of the clock increases the time the latch is transparent. With the introduction of the DLL the dead time is kept to just the time a particular part needs to satisfy hold time requirements. Another scheme is described to reduce glitch power where a circuit element (e.g., latch) is introduced to act as a glitch gate. The latch prevents the early toggling signals from propagating. It is timed such that the logic that gets resolved the last passes through the latch.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" is any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Here the term "supervisor" generally refers to a power controller, or power management, unit (a "p-unit"), which monitors and manages power and performance related parameters for one or more associated power domains, either alone or in cooperation with one or more other p-units. Power/performance related parameters may include but are not limited to domain power, platform power, voltage, voltage domain current, die current, load-line, temperature, utilization, clock frequency, processing efficiency, current/future workload information, and other parameters. It may determine new power or performance parameters (limits, average operational, etc.) for the one or more domains. These parameters may then be communicated to supervisee p-units, or directly to controlled or monitored entities such as VR or clock throttle control registers, via one or more fabrics and/or interconnects. A supervisor learns of the workload (present and future) of one or more dies, power measurements of the one or more dies, and other parameters (e.g., platform level power boundaries) and determines new power limits for the one or more dies. These power limits are then communicated by supervisor p-units to the supervisee p-units via one or more fabrics and/or interconnect. In examples where a die has one p-unit, a supervisor (Svor) p-unit is also referred to as supervisor die.

Here the term "supervisee" generally refers to a power controller, or power management, unit (a "p-unit"), which monitors and manages power and performance related parameters for one or more associated power domains, either alone or in cooperation with one or more other p-units and receives instructions from a supervisor to set power and/or performance parameters (e.g., supply voltage, operating frequency, maximum current, throttling threshold, etc.) for its associated power domain. In examples where a die has one p-unit, a supervisee (Svee) p-unit may also be referred to as a supervisee die. Note that a p-unit may serve either as a Svor, a Svee, or both a Svor/Svee p-unit.

Here, the term "processor core" generally refers to an independent execution unit that can run one program thread at a time in parallel with other cores. A processor core may include a dedicated power controller or power control unit (p-unit) which can be dynamically or statically configured as a supervisor or supervisee. This dedicated p-unit is also referred to as an autonomous p-unit, in some examples. In some examples, all processor cores are of the same size and functionality i.e., symmetric cores. However, processor cores can also be asymmetric. For example, some processor cores have different size and/or function than other processor cores. A processor core can be a virtual processor core or a physical processor core.

Here the term "die" generally refers to a single continuous piece of semiconductor material (e.g. silicon) where transistors or other components making up a processor core may reside. Multi-core processors may have two or more processors on a single die, but alternatively, the two or more processors may be provided on two or more respective dies. Each die has a dedicated power controller or power control unit (p-unit) power controller or power control unit (p-unit) which can be dynamically or statically configured as a supervisor or supervisee. In some examples, dies are of the same size and functionality i.e., symmetric cores. However, dies can also be asymmetric. For example, some dies have different size and/or function than other dies.

Here, the term "interconnect" refers to a communication link, or channel, between two or more points or nodes. It may comprise one or more separate conduction paths such as wires, vias, waveguides, passive components, and/or active components. It may also comprise a fabric.

Here the term "interface" generally refers to software and/or hardware used to communicate with an interconnect. An interface may include logic and I/O driver/receiver to send and receive data over the interconnect or one or more wires.

Here the term "fabric" generally refers to communication mechanism having a known set of sources, destinations, routing rules, topology and other properties. The sources and destinations may be any type of data handling functional unit such as power management units. Fabrics can be two-dimensional spanning along an x-y plane of a die and/or three-dimensional (3D) spanning along an x-y-z plane of a stack of vertical and horizontally positioned dies. A single fabric may span multiple dies. A fabric can take any topology such as mesh topology, star topology, daisy chain topology. A fabric may be part of a network-on-chip (NoC) with multiple agents. These agents can be any functional unit.

Here the term "dielet" or "chiplet" generally refers to a physically distinct semiconductor die, typically connected to an adjacent die in a way that allows the fabric across a die boundary to function like a single fabric rather than as two distinct fabrics. Thus at least some dies may be dielets. Each dielet may include one or more p-units which can be dynamically or statically configured as a supervisor, supervisee or both.

Here the term "domain" generally refers to a logical or physical perimeter that has similar properties (e.g., supply voltage, operating frequency, type of circuits or logic, and/or workload type) and/or is controlled by a particular agent. For example, a domain may be a group of logic units or function units that are controlled by a particular supervisor. A domain may also be referred to an Autonomous Perimeter (AP). A domain can be an entire system-on-chip (SoC) or part of the SoC, and is governed by a p-unit.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1: An apparatus comprising: a first driver to receive a first input and having a first output; a second driver to receive a second input and having a second output, wherein the first input is complementary of the second input; a first shunt-series set of inductors coupled to the first output; and a second shunt-series set of inductors coupled to the second output, wherein the first shunt-series set of inductors is coupled to the second shunt-series set of inductors via a resistor based digital-to-analog converter (R-DAC).

Example 2: The apparatus of example 1, comprising a memory element coupled to the first output and the second output.

Example 3: The apparatus of example 2, wherein the memory element comprises cross-coupled inverters.

Example 4: The apparatus of example 3, wherein the cross-coupled inverters are about eight times smaller than the first driver or the second driver.

Example 5: The apparatus of example 1, wherein the R-DAC is operable to adjust jitter and delay of the apparatus.

Example 6: The apparatus of example 1, wherein the R-DAC is controlled by a digital code, wherein the digital code resulting in a smallest resistance of the R-DAC causes the apparatus to provide shortest propagation delay and lowest jitter.

Example 7: The apparatus of example 1, wherein the R-DAC is controlled by a digital code, wherein the digital code resulting in a highest resistance of the R-DAC causes the apparatus to provide longest propagation delay and highest jitter.

Example 8: The apparatus of example 1, wherein the first driver comprises a first inverter, and wherein the second driver comprises a second inverter.

Example 9: The apparatus of example 1, wherein the first and second drivers are power gated.

Example 10: The apparatus of example 1, wherein the first shunt-series set of inductors comprises: a first inductor coupled in series between the first output and a third output; and a second inductor coupled with the first output and a node that provides a common mode voltage.

Example 11: The apparatus of example 10, wherein the second shunt-series set of inductors comprises: a third inductor coupled in series between the second output and a fourth output; and a fourth inductor coupled with the second output and the node.

Example 12: An apparatus comprising: an I-path to generate an I-clock; a Q-path to generate Q-clock, wherein the Q-clock is substantially 90 phase-shifted relative to the I-clock; and a node coupled to the I-path and the Q-path, wherein the node is to receive an input clock; wherein the I-path comprises: an inverter; a first switch capacitor with adjustable capacitance, the first switch coupled to an output of the inverter; a resistor based digital-to-analog converter (R-DAC); a second switch capacitor with adjustable capacitance; and a shunt-series set of inductors comprising a shunt inductor coupled to the R-DAC, and a series inductor coupled to the first switch capacitor and the second switch capacitor.

Example 13: The apparatus of example 12, wherein the node is coupled to an input of the inverter of the I-path.

Example 14: The apparatus of example 12, wherein the Q-path comprises: a first inverter; a first switch capacitor with adjustable capacitance, the first switch coupled to an output of the first inverter; a second inverter; a second switch capacitor coupled to an output of the second inverter; a R-DAC; a third switch capacitor with adjustable capacitance; and a shunt-series set of inductors comprising a shunt inductor coupled to the R-DAC, and a series inductor coupled to the second switch capacitor and the third switch capacitor.

Example 15: A system comprising: a processor; a wireless interface to allow the processor to communicate with another device; a memory coupled to the processor, wherein the processor includes a serial-deserializer transmitter which includes a clock buffer which comprises: a first driver to receive a first input and having a first output; a second driver to receive a second input and having a second output, wherein the first input is complementary of the second input; a first shunt-series set of inductors coupled to the first output; and a second shunt-series set of inductors coupled to the second output, wherein the first shunt-series set of inductors is coupled to the second shunt-series set of inductors via a resistor based digital-to-analog converter (R-DAC).

Example 16: The system of example 15, wherein the clock buffer includes a memory element coupled to the first output and the second output.

Example 17: The system of claim 16, wherein the memory element comprises cross-coupled inverters.

Example 18: The system of example 17, wherein the cross-coupled inverters are about eight times smaller than the first driver or the second driver.

Example 19: The system of example 15 wherein the R-DAC is operable to adjust jitter and delay of the clock buffer.

Example 20: The system of example 15, wherein the R-DAC is controlled by a digital code, wherein the digital code resulting in a smallest resistance of the R-DAC causes the clock buffer to provide shortest propagation delay and lowest jitter.

Example 21: The system of example 15, wherein the R-DAC is controlled by a digital code, wherein the digital code resulting in a highest resistance of the R-DAC causes the clock buffer to provide longest propagation delay and highest jitter.

Example 22: An apparatus comprising: a first differential clock buffer with shunt-series set of inductors; and a second differential clock buffer with shunt-series set of inductors, wherein the first differential clock buffer is coupled to the second differential clock buffer such that an output of the second differential clock buffer is coupled to an input of the first differential clock buffer.

Example 23: The apparatus of example 22, wherein the first or second differential clock buffer comprises: a first driver to receive a first input and having a first output; a second driver to receive a second input and having a second output, wherein the first input is complementary of the second input; a first shunt-series set of inductors coupled to the first output; and a second shunt-series set of inductors coupled to the second output, wherein the first shunt-series set of inductors is coupled to the second shunt-series set of inductors via a resistor based digital-to-analog converter (R-DAC).

Example 24: The apparatus of example 23, comprising a memory element coupled to the first output and the second output.

Example 25: The apparatus of example 24, wherein the memory element comprises cross-coupled inverters.

Example 26: The apparatus of example 25, wherein the cross-coupled inverters are about eight times smaller than the first driver or the second driver.

Example 27: The apparatus of example 23, wherein the R-DAC is operable to adjust jitter and delay of the apparatus.

Example 28: The apparatus of example 23, wherein the R-DAC is controlled by a digital code, wherein the digital code resulting in a smallest resistance of the R-DAC causes the apparatus to provide shortest propagation delay and lowest jitter.

Example 29: The apparatus of example 23, wherein the R-DAC is controlled by a digital code, wherein the digital code resulting in a highest resistance of the R-DAC causes the apparatus to provide longest propagation delay and highest jitter.

Example 30: The apparatus of example 23, wherein the first driver comprises a first inverter, and wherein the second driver comprises a second inverter.

Example 31: The apparatus of example 23, wherein the first and second drivers are power gated.

Example 32: The apparatus of example 23, wherein the first shunt-series set of inductors comprises: a first inductor coupled in series between the first output and a third output; and a second inductor coupled with the first output and a node that provides a common mode voltage.

Example 33: The apparatus of example 32, wherein the second shunt-series set of inductors comprises: a third inductor coupled in series between the second output and a fourth output; and a fourth inductor coupled with the second output and the node.

Example 34: An apparatus comprising: a termination device operable to provide termination impedance; and a circuitry to control the termination device, wherein the circuitry comprises feed forward mechanism that provides common mode, process, and temperature tracking to control the termination device.

Example 35: The apparatus of example 34 comprises: first and second devices that are cross-coupled, wherein one of first or second device is coupled to a drain terminal of the termination device; a third device coupled to the first and second devices; and a fourth device coupled in series to the third device, wherein the fourth device is diode connected, wherein the fourth device is coupled to a gate of the termination device.

Example 36: The apparatus of example 35 comprises: a fifth device coupled in series with the third device, wherein the fifth device is diode connected.

Example 37: The apparatus of example 36 comprises a current source coupled to the termination device and fourth device.

Example 38: A system comprising: a processor; a wireless interface to allow the processor to communicate with another device; a memory coupled to the processor, wherein the processor includes an oscillator which comprises an apparatus according to any one of examples 22 to 33.

Example 39: A system comprising: a processor; a wireless interface to allow the processor to communicate with another device; and a memory coupled to the processor, wherein the processor includes an impedance scheme which comprises an apparatus according to any one of examples 24 to 37.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. A quadrature generator apparatus comprising:
   a first driver to receive a first input and having a first output;
   a second driver to receive a second input and having a second output, wherein the first input is complementary of the second input;
   a first shunt-series set of inductors coupled to the first output; and
   a second shunt-series set of inductors coupled to the second output, wherein the first shunt-series set of inductors is coupled to the second shunt-series set of inductors via a resistor based digital-to-analog converter (R-DAC).

2. The apparatus of claim 1, comprising a memory element coupled to the first output and the second output.

3. The apparatus of claim 2, wherein the memory element comprises cross-coupled inverters.

4. The apparatus of claim 3, wherein the cross-coupled inverters are about eight times smaller than the first driver or the second driver.

5. The apparatus of claim 1, wherein the R-DAC is operable to adjust jitter and delay of the apparatus.

6. The apparatus of claim 1, wherein the R-DAC is controlled by a digital code that results in a smallest resistance of the R-DAC causes the apparatus to provide shortest propagation delay and lowest jitter.

7. The apparatus of claim 1, wherein the R-DAC is controlled by a digital code that results in a highest resistance of the R-DAC causes the apparatus to provide longest propagation delay and highest jitter.

8. The apparatus of claim 1, wherein the first driver comprises a first inverter, and wherein the second driver comprises a second inverter.

9. The apparatus of claim 1, wherein the first and second drivers are power gated.

10. The apparatus of claim 1, wherein the first shunt-series set of inductors includes:
    a first inductor coupled in series between the first output and a third output; and
    a second inductor coupled with the first output and a node that provides a common mode voltage.

11. The apparatus of claim 10, wherein the second shunt-series set of inductors comprises:
    a third inductor coupled in series between the second output and a fourth output; and
    a fourth inductor coupled with the second output and the node.

12. A quadrature generator apparatus comprising:
    a I-path to generate an I-clock;
    a Q-path to generate Q-clock, wherein the Q-clock is substantially 90 phase-shifted relative to the I-clock; and
    a node coupled to the I-path and the Q-path, wherein the node is to receive an input clock;

wherein the I-path comprises:
an inverter;
a first switch capacitor with adjustable capacitance, the first switch coupled to an output of the inverter;
a resistor based digital-to-analog converter (R-DAC);
a second switch capacitor with adjustable capacitance; and
a shunt-series set of inductors comprising a shunt inductor coupled to the R-DAC, and a series inductor coupled to the first switch capacitor and the second switch capacitor.

13. The apparatus of claim 12, wherein the node is coupled to an input of the inverter of the I-path.

14. The apparatus of claim 12, wherein the Q-path comprises:
a first inverter;
a first switch capacitor with adjustable capacitance, the first switch coupled to an output of the first inverter;
a second inverter;
a second switch capacitor coupled to an output of the second inverter;
a R-DAC;
a third switch capacitor with adjustable capacitance; and
a shunt-series set of inductors comprising a shunt inductor coupled to the R-DAC, and a series inductor coupled to the second switch capacitor and the third switch capacitor.

15. A computing system with a quadrature generator, comprising:
a processor;
a wireless interface to allow the processor to communicate with another device; and
a memory coupled to the processor, wherein the processor includes a serial-deserializer transmitter which includes a clock buffer which comprises:
a first driver to receive a first input and having a first output;
a second driver to receive a second input and having a second output, wherein the first input is complementary of the second input;
a first shunt-series set of inductors coupled to the first output; and
a second shunt-series set of inductors coupled to the second output, wherein the first shunt-series set of inductors is coupled to the second shunt-series set of inductors via a resistor based digital-to-analog converter (R-DAC).

16. The system of claim 15, wherein the clock buffer includes a memory element coupled to the first output and the second output.

17. The system of claim 16, wherein the memory element comprises cross-coupled inverters.

18. The system of claim 17, wherein the cross-coupled inverters are about eight times smaller than the first driver or the second driver.

19. The system of claim 15, wherein the R-DAC is operable to adjust jitter and delay of the clock buffer.

20. The system of claim 15, wherein the R-DAC is controlled by a digital code that results in a smallest resistance of the R-DAC causes the clock buffer to provide shortest propagation delay and lowest jitter.

21. The system of claim 15, wherein the R-DAC is controlled by a digital code that results in a highest resistance of the R-DAC causes the clock buffer to provide longest propagation delay and highest jitter.

* * * * *